United States Patent
Sukegawa et al.

(10) Patent No.: US 11,374,168 B2
(45) Date of Patent: Jun. 28, 2022

(54) PRECURSOR STRUCTURE OF PERPENDICULARLY MAGNETIZED FILM, PERPENDICULARLY MAGNETIZED FILM STRUCTURE AND METHOD FOR MANUFACTURING THE SAME, PERPENDICULAR MAGNETIZATION-TYPE MAGNETIC TUNNEL JUNCTION FILM IN WHICH SAID STRUCTURE IS USED AND METHOD FOR MANUFACTURING THE SAME, AND PERPENDICULAR MAGNETIZATION-TYPE MAGNETIC TUNNEL JUNCTION ELEMENT IN WHICH SAID STRUCTURE OR MAGNETIC TUNNEL JUNCTION FILM IS USED

(71) Applicant: NATIONAL INSTITUTE FOR MATERIALS SCIENCE, Ibaraki (JP)

(72) Inventors: Hiroaki Sukegawa, Ibaraki (JP); Thomas Scheike, Ibaraki (JP); Seiji Mitani, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 364 days.

(21) Appl. No.: 16/640,429

(22) PCT Filed: Aug. 29, 2018

(86) PCT No.: PCT/JP2018/031877
§ 371 (c)(1),
(2) Date: Feb. 20, 2020

(87) PCT Pub. No.: WO2019/049740
PCT Pub. Date: Mar. 14, 2019

(65) Prior Publication Data
US 2020/0357985 A1     Nov. 12, 2020

(30) Foreign Application Priority Data
Sep. 11, 2017 (JP) .............................. JP2017-174000

(51) Int. Cl.
*H01L 43/10* (2006.01)
*G01R 33/09* (2006.01)
(Continued)

(52) U.S. Cl.
CPC .............. *H01L 43/10* (2013.01); *G01R 33/09* (2013.01); *H01F 10/14* (2013.01); *H01L 27/222* (2013.01); *H01L 43/08* (2013.01); *H01L 43/12* (2013.01)

(58) Field of Classification Search
CPC .................................................. H01L 27/222
See application file for complete search history.

(56) References Cited

U.S. PATENT DOCUMENTS 11,217,289 B1 * 1/2022 Prasad .................... H01L 43/08
2012/0091548 A1   4/2012 Sukegawa et al.
(Continued)

FOREIGN PATENT DOCUMENTS

JP          7-320933       12/1995
JP       2013-175615        9/2013
(Continued)

OTHER PUBLICATIONS

Scheike et al., "Lattice-matched magnetic tunnel junctions using a Heusler alloy $Co_2FeAl$ and a cation-disorder spinel Mg—Al—O barrier", Applied Physics Letters, 2014, vol. 105, pp. 242407-1 to 242407-5.
(Continued)

*Primary Examiner* — Mounir S Amer
(74) *Attorney, Agent, or Firm* — Wenderoth, Lind & Ponack, L.L.P.

(57) ABSTRACT

The present invention provides a perpendicularly magnetized film structure exhibiting high interface-induced mag-
(Continued)

netic anisotropy by utilizing a combination of an alloy comprising Fe as a main component and $MgAl_2O_4$ as a basic configuration.

13 Claims, 15 Drawing Sheets

(51) Int. Cl.
    *H01L 43/12* (2006.01)
    *H01L 27/22* (2006.01)
    *H01F 10/14* (2006.01)
    *H01L 43/08* (2006.01)

(56) References Cited

U.S. PATENT DOCUMENTS

| 2012/0112299 | A1 | 5/2012 | Inomata et al. |
| 2016/0314825 | A1 | 10/2016 | Sukegawa et al. |
| 2021/0123991 | A1* | 4/2021 | Sukegawa ............ G01R 33/098 |

FOREIGN PATENT DOCUMENTS

| JP | 2017-41606 | 2/2017 |
| WO | 2010/119928 | 10/2010 |
| WO | 2010/134435 | 11/2010 |

OTHER PUBLICATIONS

Extended European Search Report dated Apr. 30, 2021 in corresponding European Patent Application No. 18852964.8.
Notice of Reason for Refusal dated Dec. 15, 2020 in corresponding Japanese Patent Application No. 2019-540909, with English Translation.
International Search Report (ISR) dated Nov. 13, 2018 in International (PCT) Application No. PCT/JP2018/031877.
Alagarsamy Perumal et al., "$L1_0$ FePt—C Nanogranular Perpendicular Anisotropy Films with Narrow Size Disuibution", Applied Physics Express, vol. 1, 101301, 2008.
S. Ikeda et al., "A perpendicular-anisotropy CoFeB—MgO magnetic tunnel junction", Nature Materials, vol. 9, pp. 721-724, Jul. 2010.
Zhenchao Wen et al., "Perpendicular magnetization of $Co_2FeAl$ full-Heusler alloy films induced by MgO interface", Applied Physics Letters, vol. 98, 242507, Jun. 2011.
Jungwoo Koo et al., "Interface perpendicular magnetic anisotropy in $Fe/MgAl_2O_4$ layered structures", Physica Status Solidi-Rapid Research Letters, vol. 8, pp. 841-844, 2014.
T. Scheike et al., "GW-09. Large Perpendicular Magnetic Anisotropy in Fe—Al/MgA-$1_2O_4$(001) epitaxial heterostructures", Intermag 2018, Digest Book, p. 1561, Apr. 23, 2018.

* cited by examiner

PRECURSOR STRUCTURE OF PERPENDICULARLY MAGNETIZED FILM, PERPENDICULARLY MAGNETIZED FILM STRUCTURE AND METHOD FOR MANUFACTURING THE SAME, PERPENDICULAR MAGNETIZATION-TYPE MAGNETIC TUNNEL JUNCTION FILM IN WHICH SAID STRUCTURE IS USED AND METHOD FOR MANUFACTURING THE SAME, AND PERPENDICULAR MAGNETIZATION-TYPE MAGNETIC TUNNEL JUNCTION ELEMENT IN WHICH SAID STRUCTURE OR MAGNETIC TUNNEL JUNCTION FILM IS USED

TECHNICAL FIELD

The present invention relates to a precursor structure of a perpendicularly magnetized film including a stacked film of a ferromagnetic thin film and an oxide thin film, and a perpendicularly magnetized film structure and a method for manufacturing the same. The present invention also relates to a perpendicular magnetization-type magnetic tunnel junction film in which the perpendicularly magnetized film structure is used and a method for manufacturing the same. The present invention further relates to a perpendicular magnetization-type magnetic tunnel junction element in which the perpendicularly magnetized film structure or magnetic tunnel junction film is used.

BACKGROUND ART

Along with the advances in high density recording and capacity increase with respect to magnetic disk devices (hard disks) and magnetoresistive random access magnetic memory (MRAM) that use ferromagnetic thin film structures, perpendicularly magnetized films that are magnetized in the direction perpendicular to the ferromagnetic film surface are utilized. For the increase in the recording density induced by miniaturization of magnetic tunnel junction elements (MTJ elements) that constitute the recording bits of MRAM using the perpendicularly magnetized film, it is required to achieve high magnetic anisotropy energy density Ku through quality improvement of the perpendicularly magnetized film.

As a method for achieving perpendicularly magnetized films, there are a method utilizing an alloy exhibiting high magnetic anisotropy and a method using an interface effect between a ferromagnetic thin film and a nonmagnetic thin film (interface-induced magnetic anisotropy). As an example of the former, Non Patent Literature 1 discloses, for example, an $L1_0$ type iron-platinum (FePt) alloy exhibiting an extremely high Ku. As an example of the latter, for example, it is known that, when a soft magnetic material such as cobalt-iron-boron (CoFeB) which do not exhibit perpendicular magnetization in the bulk form (Non Patent Literature 2) or iron (Fe) is formed into an ultrathin film shape having about a nanometer thickness, a perpendicularly magnetized film is obtained by bringing magnesium oxide (MgO) into contact with the ultrathin film. In particular, the structure obtained by the latter is also an MTJ element structure from which a high tunnel magnetoresistance ratio (TMR ratio) is easily obtained, and thus the latter is an excellent method for obtaining perpendicularly magnetized films for MRAM applications. In addition to these combinations, a method for obtaining interface-induced magnetic anisotropy using a combination of a $Co_2FeAl$ alloy layer (Non Patent Literature 3), which is one of Co-based Heusler alloys, and MgO and a combination of Fe and $MgAl_2O_4$ (Non Patent Literature 4) is also known. Furthermore, MTJ elements disclosed in Patent Literatures 1 to 4 are known as the proposal of the present applicants.

However, there is a lattice mismatch of about several percent between MgO and these soft magnetic materials and it is necessary to obtain all the layers in ultrathin film shapes having about nanometer thicknesses, and thus the decrease in magnetic anisotropy due to the effect of crystal distortion occurring at the interface is not ignored. It is known that the problem due to lattice mismatch can be solved by using $MgAl_2O_4$ instead of MgO (Non Patent Literature 4, Patent Literature 4). However, the magnetic anisotropy is greatly affected by the electronic state at the interface, it is thus necessary to realize a high crystallinity and controlled interface structure, and there is a problem that the manufacturing process of the perpendicularly magnetized film structure using $MgAl_2O_4$ is complicated. For example, the combination of a $Co_2FeAl$ alloy layer and $MgAl_2O_4$ (Patent Literature 4) has a problem that the manufacturing process of the perpendicularly magnetized film structure is complicated.

CITATION LIST

Patent Literatures

Patent Literature 1: WO 2010/119928
Patent Literature 2: WO 2010/134435
Patent Literature 3: JP 2013-175615 A
Patent Literature 4: JP 2017-041606 A

Non Patent Literatures

Non Patent Literature 1: A. Perumal, Y. K. Takahashi, and K. Hono, "$L1_0$ FePt—C Nanogranular Perpendicular Anisotropy Films with Narrow Size Distribution", Applied Physics Express, vol. 1, p. 101301 (2008).
Non Patent Literature 2: S. Ikeda et al., "A perpendicular-anisotropy CoFeB—MgO magnetic tunnel junction", Nature Materials, vol. 9, pp. 721-724(2010).
Non Patent Literature 3: Z. C. Wen, H. Sukegawa, S. Mitani, and K. Inomata, "Perpendicular magnetization of $Co_2FeAl$ full-Heusler alloy films induced by MgO interface", Applied Physics Letters, vol. 98, p. 242507 (2011).
Non Patent Literature 4: J. Koo, H. Sukegawa, and S. Mitani, "Interface perpendicular magnetic anisotropy in Fe/$MgAl_2O_4$ layered structures", physica status solidi-Rapid Research Letters, vol. 8, pp. 841-844 (2014).

SUMMARY OF INVENTION

Technical Problem

In view of such a situation, an object of the present invention is to provide a precursor structure of a perpendicularly magnetized film and a perpendicularly magnetized film structure which exhibit high interface-induced magnetic anisotropy by utilizing a combination of Fe and $MgAl_2O_4$ as a basic configuration without using a Co-based Heusler alloy, and a method for manufacturing the same.

Another object of the present invention is to provide a perpendicularly magnetized film structure and a perpendicular magnetization-type magnetic tunnel junction film (perpendicular MTJ film) which are formed using a combination of a ferromagnetic alloy comprising Fe as a main component and MgAl$_2$O$_4$, and a method for manufacturing the same. Still another object of the present invention is to provide a perpendicular magnetization-type magnetic tunnel junction element (perpendicular MTJ element) configured based on a perpendicular MTJ film produced by the method.

Solution to Problem

A precursor structure 1 of a perpendicularly magnetized film of the present invention includes a substrate (2) that is a single-crystalline substrate having a cubic system structure having a (001) plane or a substrate having a layer having a cubic system structure or tetragonal system structure having a (001) plane; an underlayer (3) that is disposed on the substrate 2 and composed of a conductive material having a good electric conductivity; an iron-based alloy layer (4) that is disposed on the underlayer 3 and includes a layer composed of an iron-based alloy comprising aluminum; a first metal film (51) that is disposed on the iron-based alloy layer 4 and composed of a predetermined metal element, the first metal film 51 not containing aluminum; and a second alloy film (52) that is disposed on the first metal film 51 and composed of a predetermined alloy element, the second alloy film 52 containing aluminum, for example, as illustrated in FIG. 1. The predetermined metal element is a metal element constituting an oxide having a spinel structure, and the predetermined alloy element is converted to an oxide having a spinel structure or an oxide having a structure in which a cation site of a spinel structure is disordered, when the alloy element is oxidized.

In the precursor structure 1 of the perpendicularly magnetized film of the present invention, the iron-based alloy layer 4 is preferably represented by an Fe$_{100-x}$M$_x$ layer, where M is one or more elements selected from the group consisting of Al, Si, Ga, and Ge, and 0<x<40.

A perpendicularly magnetized film structure 101 of the present invention has a perpendicular magnetization structure in which the iron-based alloy layer 4 is converted to a first perpendicularly magnetized layer (7) and a stacked structure (5) of the first metal film 51 and the second alloy film 52 is converted to a nonmagnetic layer (6) by subjecting the precursor structure of a perpendicularly magnetized film to an oxidation treatment, and has a protective film layer (8) that is disposed on the nonmagnetic layer 6 and is composed of a nonmagnetic layer different from the nonmagnetic layer 6, for example, as illustrated in FIG. 2.

In the perpendicularly magnetized film structure 101 of the present invention, the nonmagnetic layer 6 is preferably a Mg$_{1-y}$Al$_y$—O$_x$ layer (0<y≤1), (0.8≤x≤1.7) of a crystal substance.

A perpendicular magnetization-type magnetic tunnel junction film 11 (perpendicular MTJ film 11) of the present invention includes a substrate (12) that is a single-crystalline substrate having a cubic system structure having a (001) plane or a substrate having a layer having a cubic system structure or tetragonal system structure having a (001) plane; an underlayer (13) that is disposed on the substrate and composed of a conductive material having a good electric conductivity; an iron-based alloy layer (14, lower ferromagnetic layer 14) that is disposed on the underlayer 13 and includes a layer composed of an iron-based alloy comprising aluminum or a first perpendicularly magnetized layer (18) to which the iron-based alloy layer 14 is converted; a nonmagnetic layer (19) obtained by oxidizing a stacked structure (15) of a first metal film (151) and a second alloy film (152), the first metal film (151) being disposed on the iron-based alloy layer 14 or the first perpendicularly magnetized layer 18, containing a predetermined metal element, and not containing aluminum, the second alloy film (152) being disposed on the first metal film 151, containing a predetermined alloy element, and containing aluminum; and a second ferromagnetic layer (16) that is disposed on the nonmagnetic layer 19 and composed of a ferromagnetic material selected from the group consisting of a cobalt-iron alloy, a cobalt-iron-boron alloy, a manganese-gallium alloy, a manganese-germanium alloy, and an alloy of one or more elements selected from the group consisting of iron and cobalt and one or more elements selected from the group consisting of platinum and palladium or a second perpendicularly magnetized layer (20) to which the second ferromagnetic layer 16 is converted, for example, as illustrated in FIG. 3. The nonmagnetic layer (19) functions as a tunnel barrier layer (19).

A perpendicular magnetization-type magnetic tunnel junction element 21 (perpendicular MTJ element 21) of the present invention has an upper electrode and an interlayer insulating film layer on the perpendicular MTJ film 11 and includes a substrate (22), an underlayer (23), a first perpendicularly magnetized layer (24), a nonmagnetic layer (25), a second perpendicularly magnetized layer (26), a protective film layer (27), an upper electrode (28), and an interlayer insulating film layer (30), for example, as illustrated in FIG. 4. The nonmagnetic layer (25) functions as a tunnel barrier layer (25).

A method for manufacturing a perpendicularly magnetized film structure of the present invention includes a step of providing a single-crystalline substrate having a cubic system structure having a (001) plane or a substrate having a layer having a cubic system structure or tetragonal system structure having a (001) plane; a step of forming an underlayer composed of a conductive material having a good electric conductivity on the substrate; a step of forming an iron-based alloy layer comprising aluminum on the underlayer; a step of forming a first metal film composed of a predetermined metal element on the iron-based alloy layer, the metal element not containing aluminum; a step of forming a second alloy film composed of a predetermined alloy element on the first metal film, the alloy element containing aluminum; a step of forming an oxide layer by subjecting the first metal film and the second alloy film to an oxidation treatment to form a perpendicularly magnetized layer; and a step of forming a nonmagnetic layer having a (001) plane on the perpendicularly magnetized layer.

In the method for manufacturing a perpendicularly magnetized film structure of the present invention, the oxide layer is preferably an oxide layer of a Mg$_{1-x}$Al$_x$ (0<x≤1) alloy.

A method for manufacturing a perpendicular MTJ film of the present invention includes a step of forming a substrate, an underlayer, a perpendicularly magnetized layer, and a nonmagnetic layer by the method for manufacturing a perpendicularly magnetized film structure described above; and a step of forming, on the nonmagnetic layer, a second perpendicularly magnetized layer composed of a ferromagnetic material selected from the group consisting of a cobalt-iron alloy, a cobalt-iron-boron alloy, a manganese-gallium alloy, a manganese-germanium alloy, and an alloy of one or more elements selected from the group consisting of iron and cobalt and one or more elements selected from the group consisting of platinum and palladium.

A method for manufacturing a perpendicular MTJ element of the present invention includes a step of forming an upper electrode and an interlayer insulating film layer in the method for manufacturing a perpendicular MTJ film described above.

Advantageous Effects of Invention

According to the perpendicularly magnetized film of the present invention, a structure exhibiting greater perpendicular magnetic anisotropy (PMA) than conventional structures (for example, Fe/MgAl$_2$O$_4$ and Co-based alloy Co$_2$FeAl/MgAl$_2$O$_4$) can be realized by forming a stacked film of a magnetic layer composed of an alloy comprising Fe as a main component and Mg—Al—O (for example, MgAl$_2$O$_4$).

According to the perpendicularly magnetized film of the present invention, it is possible to realize high PMA and improved heat resistance, for example, by using Fe—Al (comprising Al up to about 40 atomic %) in the magnetic layer and setting the Al composition to an optimum value. In particular, the saturation magnetization Ms of the magnetic layer is smaller (about 900 to 1300 emu/cm$^3$) than that of pure Fe (1700 emu/cm$^3$) and has an effect of effectively reducing the thin film shape effect (in-plane magnetic anisotropy term proportional to Ms$^2$) and thus PMA energy per unit volume can be improved.

According to the perpendicularly magnetized film of the present invention, the effect of lattice mismatch at interfaces can be minimized because of favorable lattice matching property between an Fe-based alloy and Mg—Al—O (for example, MgAl$_2$O$_4$), and large PMA is obtained. Furthermore, a great change in magnetic anisotropy due to voltage application can also be expected.

According to the perpendicular MTJ film and perpendicular MTJ element of the present invention, a high TMR ratio due to a remarkable coherent tunnel effect can be expected, for example, as in the Fe/MgAl$_2$O$_4$ structure and excellent characteristics as a spintronic device using a perpendicularly magnetized film can be obtained because of the combination of an Fe-based alloy and Mg—Al oxide.

According to the perpendicular MTJ element using the perpendicularly magnetized film of the present invention, it is possible to secure the design margin of element as well as heat resistance as the Ms and PMA characteristics of the magnetic layer can be adjusted by continuous modulation of the composition of Fe—Al.

According to the precursor structure of a perpendicularly magnetized film of the present invention, the perpendicularly magnetized film having the above-described effect can be easily obtained by performing oxidation treatment and heat treatment appropriately.

According to the method for manufacturing a perpendicularly magnetized film of the present invention, the manufacturing process is simplified because of the combination of an Fe-based alloy and Mg—Al oxide.

DESCRIPTION OF EMBODIMENTS (A) Basic Structure

Hereinafter, the precursor structure of a perpendicularly magnetized film and the perpendicularly magnetized film structure according to the embodiments of the present invention will be described in detail with reference to FIG. 1, FIG. 2, and FIG. 5.

Figure 1:
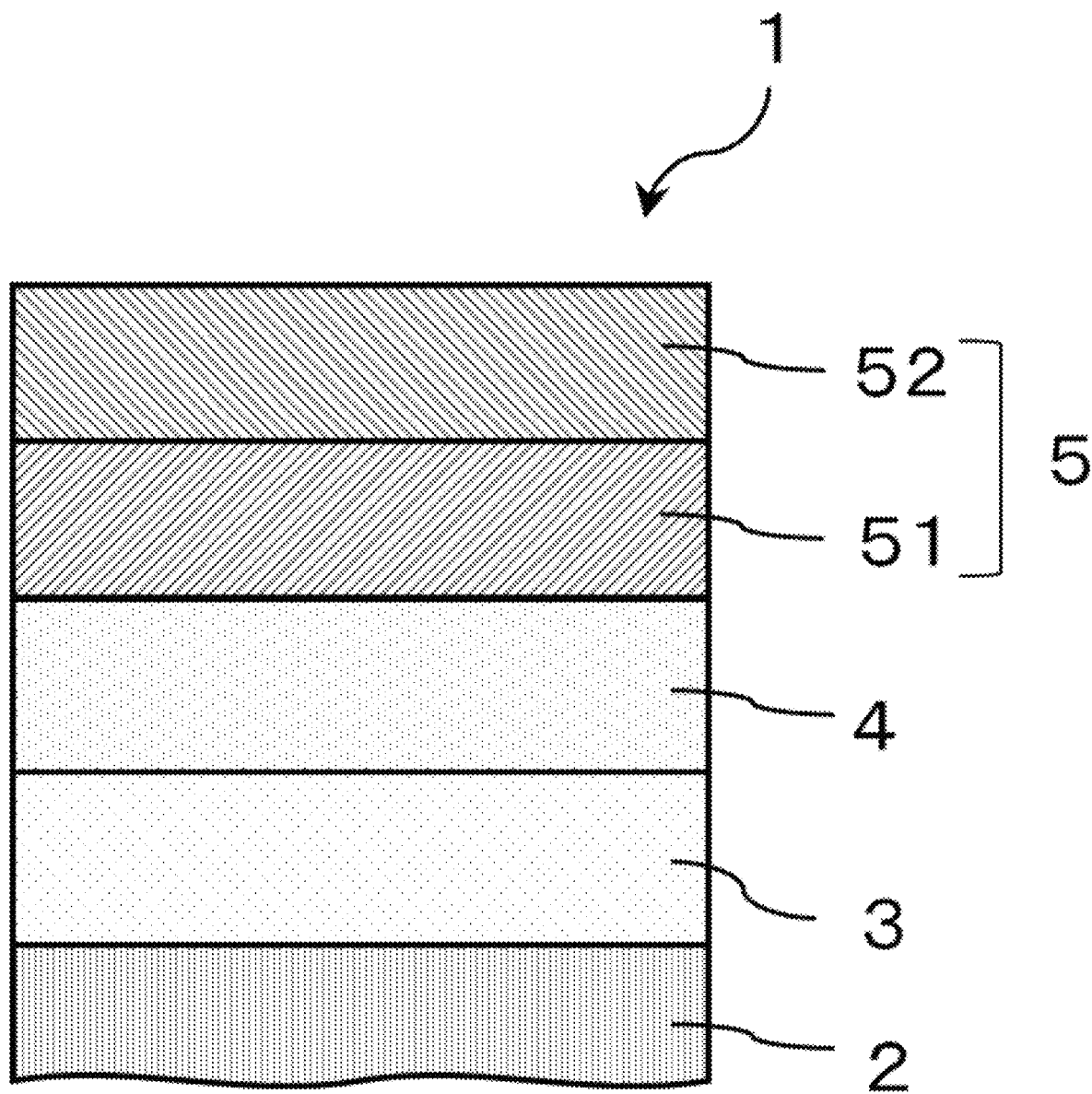
FIG. 1 is a sectional view illustrating a precursor structure of a perpendicularly magnetized film according to an embodiment of the present invention.

As illustrated in FIG. 1, a precursor structure 1 of a perpendicularly magnetized film according to an embodiment of the present invention includes a substrate 2, an underlayer 3, an iron-based alloy layer 4, and a nonmagnetic stacked structure 5 of a first metal film 51 and a second alloy film 52.

The substrate 2 is a MgO or Si single crystal having a (001) plane or a layer having a structure in which these are preferentially oriented in (001). Furthermore, magnesium-aluminum spinel (MgAl$_2$O$_4$), strontium titanate (SrTiO$_3$), magnesium-titanium oxide (MgTiO$_x$), and Ge may be used as the material for the substrate 2.

The Underlayer 3 is composed of a conductive metal or alloy, and chromium (Cr), silver (Ag), gold (Au), ruthenium (Ru), rhenium (Re), any alloy thereof, a NiAl (nickel-aluminum) alloy, titanium nitride, and the like are preferable. The Underlayer 3 is in a thin film shape having a thickness of, for example, about 5 to 200 nm.

The iron-based alloy layer 4 is a layer composed of a layer of an iron-based alloy comprising Al, and is, for example, $Fe_3Al$.

Figure 5:
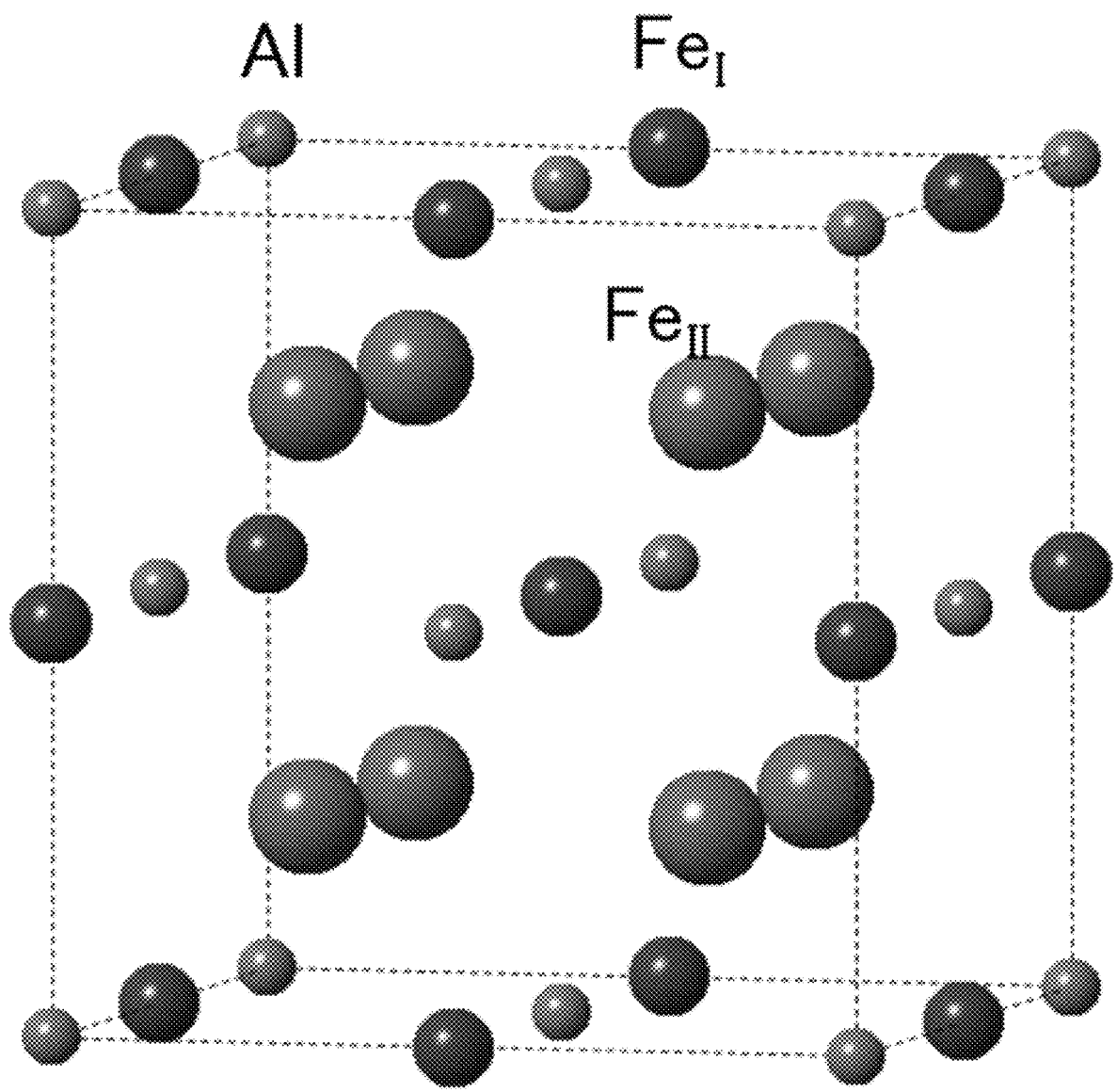
FIG. 5 is a configuration diagram of the crystal structure of Fe$_3$Al.

FIG. 5 is a configuration diagram of the crystal structure of $Fe_3Al$. $Fe_3Al$ has a crystal structure of $D0_3$ type ($BiF_3$ type, space group No. 225: Fm-3 m) and has a Curie temperature Tc=713K and a lattice constant $a_{Fe3Al}$=0.5789 nm. Fe is in two sites ($Fe_I$, $Fe_{II}$) with different symmetry positions, the magnetic moments thereof are $Fe_I$ (experimental value)=$2.2\mu_B$/atom and $Fe_{II}$ (experimental value)=$1.5\mu_B$/atom, respectively, and the sum is 2.2×2+ 1.5=$5.9\mu_B$/chemical formula. Here, $\mu_B$ is the Bohr magneton. The iron-based alloy layer 4 is in an ultrathin film shape having a thickness of about 0.5 to 2 nm and is grown in (001). The iron-based alloy layer 4 is a layer to be converted to the perpendicularly magnetized layer 7 illustrated in FIG. 2 by a predetermined treatment.

The most stable crystal structure of $Fe_3Al$ is $D0_3$ type. The crystal structure of Fe is a body-centered cubic (bcc structure), and the crystal structure of FeAl having a composition comprising more Al than $Fe_3Al$ is B2 type. The lattice constant of $D0_3$ type $Fe_3Al$ is two times that of Fe due to the ordering of Fe—Al site. In this regard, a bcc structure in which Fe and Al sites are disordered is obtained in some cases depending on the manufacturing method, but a layer having such structure also effectively functions as the iron-based alloy layer 4 in the present embodiment. On the other hand, B2 type FeAl is a nonmagnetic material and thus cannot be utilized as the iron-based alloy layer 4. Thus, it is possible to continuously change the Fe—Al composition in a range having ferromagnetism, that is, a preferable composition range is $Fe_{100-x}Al_x$ (0<x<40).

A part or most of Al atoms in the iron-based alloy layer 4 may move to the nonmagnetic layer 6 by predetermined oxidation treatment and heat treatment. In other words, for example, even when substantially all the Al atoms in the iron-based alloy layer 4 move to the nonmagnetic layer 6, it is acceptable as long as the iron-based alloy layer 4 functions as the perpendicularly magnetized film 7.

An equivalent effect is realized even in an iron-based ferromagnetic material having a $D0_3$ structure and characteristics similar to those of Fe—Al, for example, $Fe_3Si$, $Fe_3Ga$, and $Fe_3Ge$ as the iron-based alloy layer 4. Hence, $Fe_{100-x}M_x$ (M is one or more elements selected from the group consisting of Al, Si, Ga, and Ge, and 0<x<40) can be used as a general notation of the iron-based alloy layer 4.

The stacked structure 5 is composed of the first metal film 51 and the second alloy film 52 and is a layer to be converted to the nonmagnetic layer 6 by predetermined oxidation treatment and heat treatment. The heat treatment is not necessarily required but perpendicular magnetic anisotropy (PMA) can be improved by performing a proper heat treatment. The first metal film 51 is composed of a predetermined metal element and is disposed on the iron-based alloy layer 4, and the first metal film 51 does not contain aluminum. The predetermined metal element is a metal element constituting an oxide having a spinel structure and is, for example, Mg. It should be noted that the first metal layer 51 is not necessarily required. The thickness of the first metal layer 51 is, for example, 0 to about 1 nm.

The second alloy film 52 is composed of a predetermined alloy element and is disposed on the first metal film 51, and the second alloy film 52 contains aluminum. The predetermined alloy element is an alloy element to be an oxide having a spinel structure or an oxide having a structure in which cation sites of a spinel structure are disordered when being oxidized and is, for example, $Mg_{1-x}Al_x$ (0<x≤1) which is a Mg—Al composition. The thickness of the second metal layer 52 is, for example, about 0.2 to 3 nm.

Figure 2:
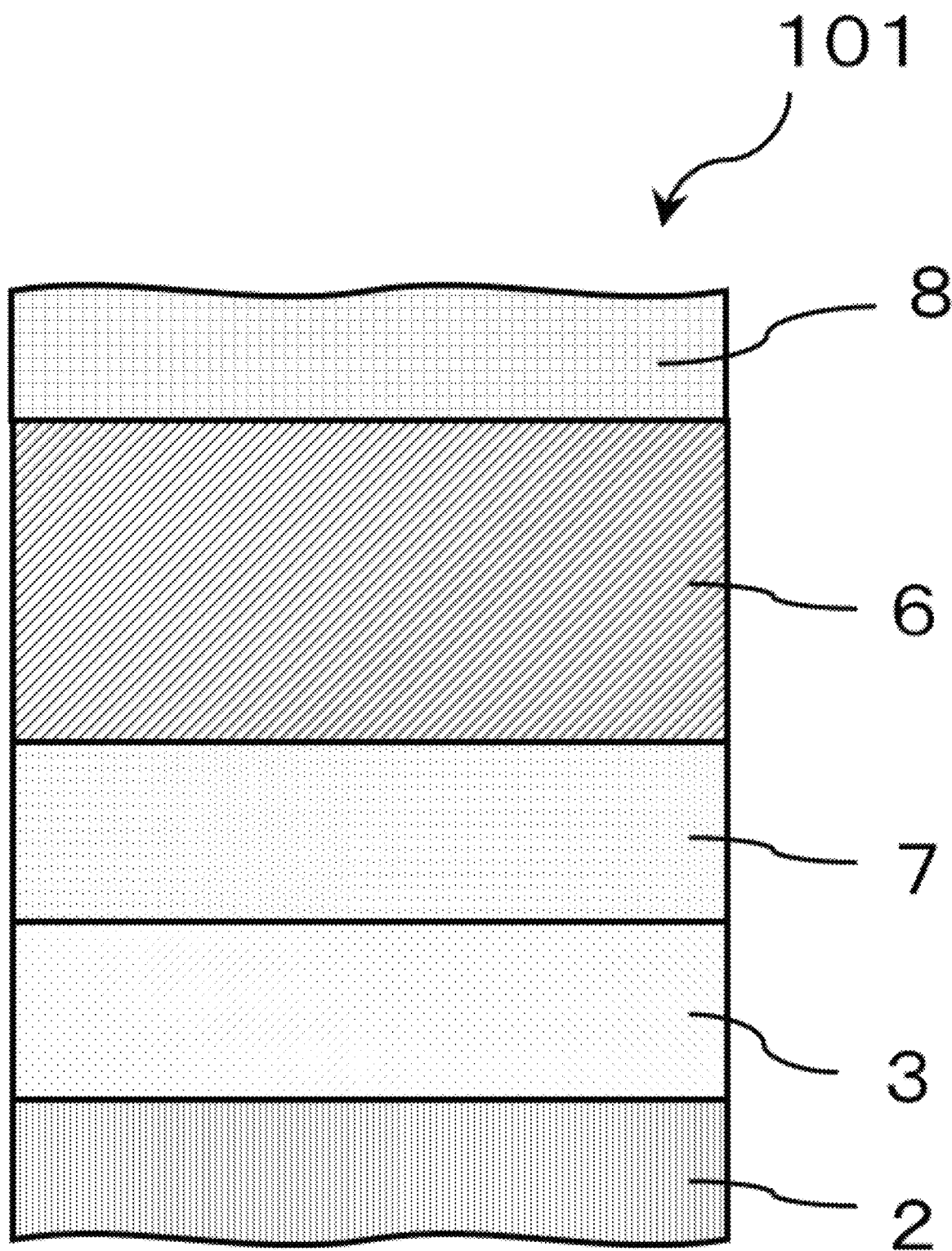
FIG. 2 is a sectional view illustrating a perpendicularly magnetized film structure according to an embodiment of the present invention.

FIG. 2 is a sectional view illustrating a perpendicularly magnetized film structure 101 according to an embodiment of the present invention. The perpendicularly magnetized film structure 101 is obtained by subjecting the precursor structure 1 of a perpendicularly magnetized film illustrated in FIG. 1 to a predetermined oxidation treatment.

As the predetermined oxidation treatment, for example, natural oxidation in which oxidation is performed using oxygen gas and the like, radical oxidation in which oxidation is performed using oxygen radical, and plasma oxidation in which oxidation is performed using oxygen plasma can be used. By the oxidation treatment, the stacked structure 5 is converted to the nonmagnetic layer 6 composed of an oxide and the iron-based alloy layer 4 is converted to the perpendicularly magnetized layer 7. The predetermined heat treatment is performed, for example, in a vacuum, the annealing temperature is in a range of 200° C. to 500° C., and the PMA of the perpendicularly magnetized layer 7 is improved. The nonmagnetic layer 6 is composed of a layer which is formed on the iron-based alloy layer 4 (or the perpendicularly magnetized layer 7), is an oxide having a spinel structure or an oxide having a structure in which cation sites of a spinel structure are disordered, and is grown with a (001) plane. This layer has a role of imparting perpendicular magnetic anisotropy to the iron-based alloy layer 4 and converting the iron-based alloy layer 4 to the perpendicularly magnetized layer 7. The constituent material of the nonmagnetic layer 6 is preferably Mg—Al oxide, and the Mg—Al composition may be $Mg_{1-x}Al_x$ (0<x≤1). Furthermore, this layer may have a spinel structure ($AB_2O_4$) belonging to a cubic system or a structure in which cation sites of a spinel structure are disordered in the case of a cubic crystal. A and B in $AB_2O_4$ are metals, and examples thereof include Mg, Al, Li, Zn, In, Ga, Cd, Cr, V, and Ti. The film thickness of the nonmagnetic layer 6 can be varied depending on the thicknesses of the first metal layer 51 and second alloy layer 52 and is typically about 0.5 to 4 nm.

The protective film layer 8 is disposed on the nonmagnetic layer 6, is a nonmagnetic layer different from the nonmagnetic layer 6, and is, for example, a metal layer of tantalum (Ta), ruthenium (Ru), gold (Au) and the like. The thickness of the protective film layer 8 is, for example, 2 to 20 nm.

The protective film layer 8 illustrated in FIG. 2 is provided to prevent peroxidation and contamination of the surface of the perpendicularly magnetized film structure when the magnetic characteristics are measured in Examples. Therefore, the presence or absence of the protective film layer 8 does not affect the function of a perpendicularly magnetized film. On the other hand, a structure in which a metal layer is disposed on a perpendicularly magnetized film structure exhibits a magnetoresistive effect (for example, tunnel anisotropic magnetoresistive effect, commonly known as TAMR effect) different from the tunnel magnetoresistive effect, and this structure can be thus utilized as a device with a magnetic sensor function. In this case, the protective film layer 8 is also called an upper electrode layer or a cap layer.

Next, the perpendicular MTJ film and perpendicular MTJ element according to the embodiments of the present invention will be described in detail with reference to FIG. 3 and FIG. 4.

Figure 3:
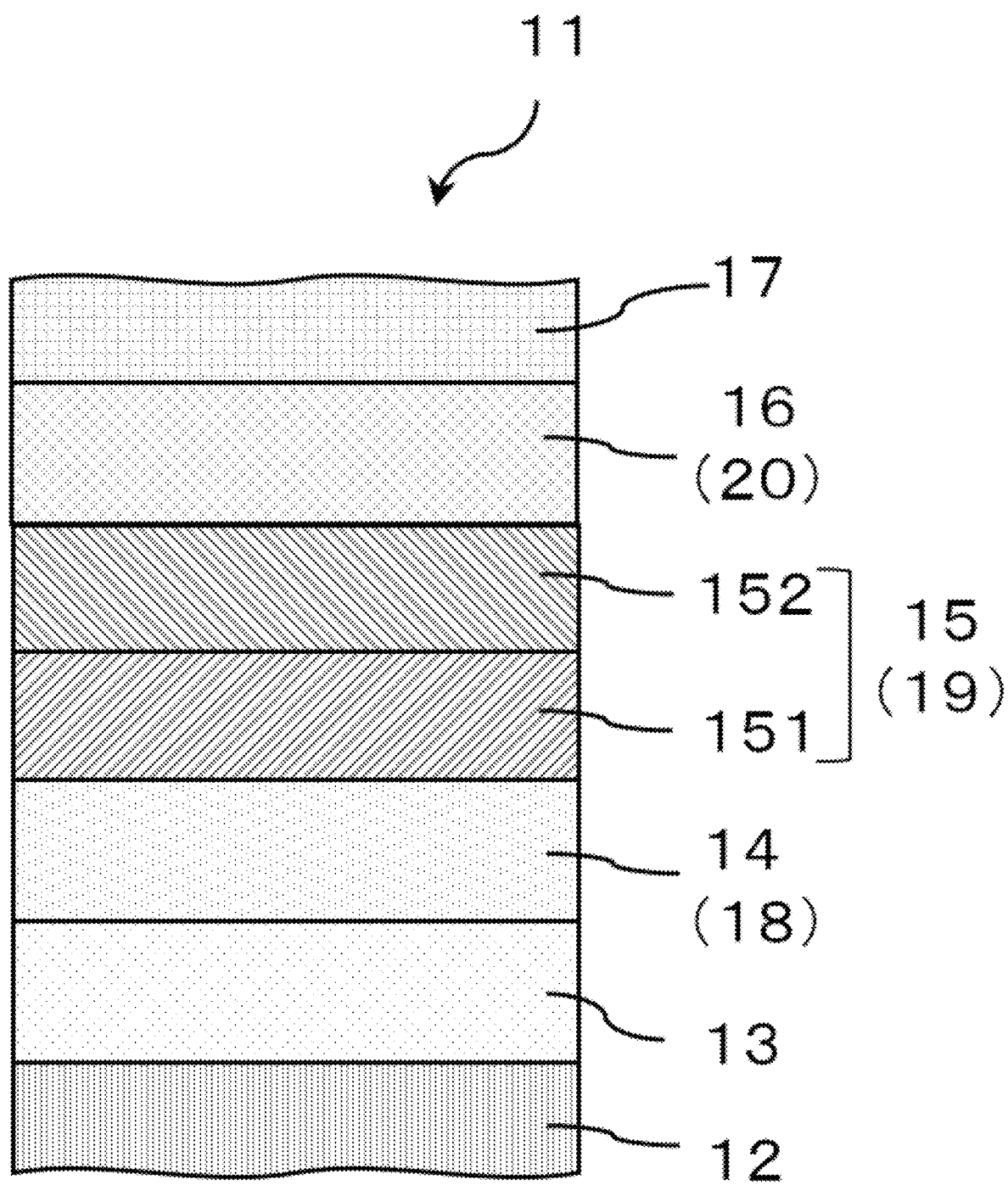
FIG. 3 is a sectional view illustrating a perpendicular magnetization-type magnetic tunnel junction (MTJ) film according to an embodiment of the present invention.

As illustrated in FIG. 3, a perpendicular MTJ film 11 according to an embodiment of the present invention has a substrate 12, an underlayer 13, an iron-based alloy layer 14, a nonmagnetic stacked structure 15 composed of a first metal film 151 and a second alloy film 152, a second ferromagnetic layer 16, and a protective film layer 17 when the respective layers are formed. In the perpendicular MTJ film, the iron-based alloy layer 14 is converted to a first perpendicularly magnetized layer 18, the stacked structure 15 is converted to a nonmagnetic layer 19 (tunnel barrier layer 19), and the second ferromagnetic layer 16 is converted to a second perpendicularly magnetized layer 20 by an oxidation treatment after the film formation.

In other words, the iron-based alloy layer 14 is a layer to be converted to the first perpendicularly magnetized layer 18 by a predetermined treatment.

The nonmagnetic stacked structure 15 is composed of the first metal film 151 and the second alloy film 152 and is converted to the tunnel barrier layer 19 by an oxidation treatment. The first metal film 151 is composed of a predetermined metal element and is disposed on the iron-based alloy layer 14, and the first metal film 151 does not contain aluminum. The predetermined metal element is a metal element constituting an oxide having a spinel structure and is, for example, Mg. The second alloy film 152 is composed of a predetermined alloy element and is disposed on the first metal film 151, and the second alloy film 152 contains aluminum.

The second ferromagnetic layer 16 is in direct contact with the nonmagnetic layer 15, and a known perpendicularly magnetized film can be used. Therefore, it is possible to utilize a ferromagnetic layer selected from the group consisting of a cobalt-iron alloy, a cobalt-iron-boron alloy, a manganese-gallium alloy, a manganese-germanium alloy, and an alloy of one or more elements selected from the group consisting of iron and cobalt and one or more elements selected from the group consisting of platinum and palladium. In addition, the same structure and material as those of the iron-based alloy layer 14 can be used. Furthermore, the second ferromagnetic layer 16 may include a perpendicularly magnetized film having an amorphous structure, for example, a terbium-cobalt-iron (Tb—Co—Fe) alloy film. The second ferromagnetic layer 16 has a film thickness of about 1 nm to 10 nm and may have a three-layer structure of, for example, perpendicularly magnetized film/ Ru (0.5 to 1.2 nm)/perpendicularly magnetized film. The second ferromagnetic layer 16 is a layer to be converted to a second perpendicularly magnetized film 20 by a properly selected film forming technique and a heat treatment.

The tunnel barrier layer 19 not only has the purpose of imparting perpendicular magnetic anisotropy but also has a role of a tunnel barrier in the case of manufacturing an MTJ element. The tunnel barrier layer 19 is preferably grown with a (001) plane and a plane equivalent thereto. Thereby, a perpendicular MTJ element in which the first perpendicularly magnetized layer 18 and the second perpendicularly magnetized film 20 are partly grown in (001), and thus a high TMR ratio is realized.

The protective film layer 17 is disposed on the second perpendicularly magnetized film 20 and is formed of a nonmagnetic layer different from the nonmagnetic layer 19, for example, a metal layer of tantalum (Ta), ruthenium (Ru), gold (Au) and the like. The thickness of the protective film layer 17 is, for example, 2 to 20 nm.

Figure 4:
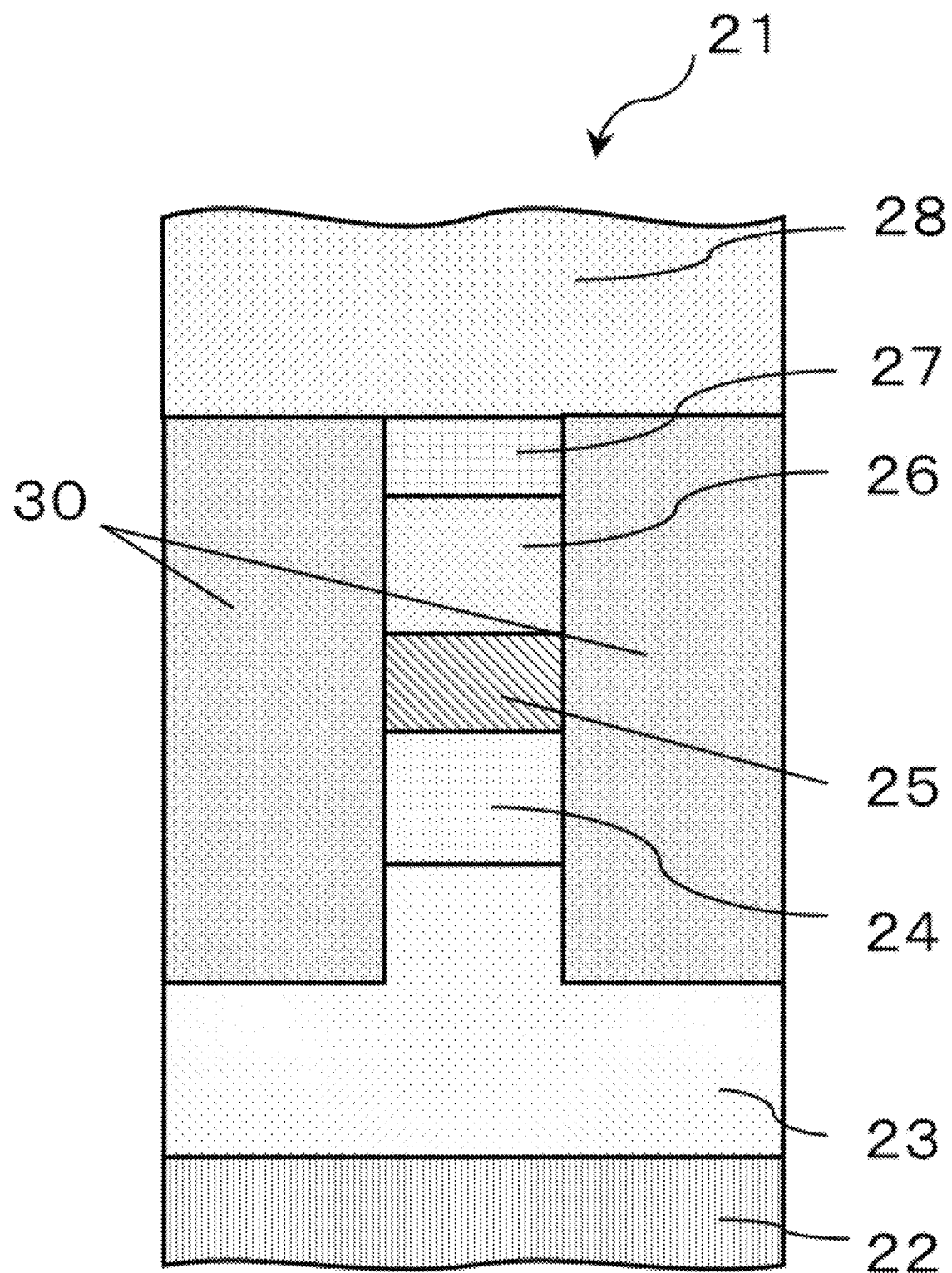
FIG. 4 is a sectional view illustrating a perpendicular magnetization-type magnetic tunnel junction (MTJ) element according to an embodiment of the present invention.

As illustrated in FIG. 4, a perpendicular MTJ element 21 according to an embodiment of the present invention includes a substrate 22, an underlayer 23, a first perpendicularly magnetized layer 24, a nonmagnetic layer 25 (tunnel barrier layer 25), a second perpendicularly magnetized layer 26, a protective film layer 27, an upper electrode 28, and an interlayer insulating film layer 30.

For the respective layers from the substrate 22 to the protective film layer 27, the same structures as those of the respective layers from the substrate 12 to the protective film layer 17 in the perpendicular MTJ film 11 described above can be used. For the upper electrode 28, a metal film of Ta, Ru, Au, Pt, Al, copper (Cu) and the like is used. A typical thickness of the upper electrode 28 is 10 to 300 nm. Moreover, in the perpendicular MTJ element 21, a part of the underlayer 23, the first perpendicularly magnetized layer 24, the nonmagnetic layer 25 (tunnel barrier layer 25), the second perpendicularly magnetized layer 26, and the protective film layer 27 are removed except the portion to be the MTJ element, and an interlayer insulating film layer 30 composed of an insulator, for example, $SiO_2$ and $Al_2O_3$ is disposed at the removed portion. This structure allows a current to flow between the underlayer 23 and the upper electrode 28 in the out-of-plane direction and can allow the perpendicular MTJ element 21 to function as a perpendicular MTJ element.

(B) Manufacturing Method

Hereinafter, a method for manufacturing a precursor structure of a perpendicularly magnetized film, which is an embodiment of the present invention, will be described with reference to FIG. 1 and FIG. 2. Hereinafter, $Fe_{100-x}Al_x$ will be described as an example of the iron-based alloy used in the iron-based alloy layer 4 and Mg—Al—O will be described as an example of the oxide used in the nonmagnetic layer 6.

First, as a method for forming the underlayer 3, for example, a Cr thin film is formed at room temperature by direct current (DC) magnetron sputtering using MgO single crystal having a (001) plane as the substrate 2 and an ultrahigh vacuum magnetron sputtering apparatus (ultimate base pressure of about $6 \times 10^{-7}$ Pa). For example, argon (Ar) can be used as the process gas for sputtering. The Cr film thickness is, for example, 40 nm but may be thinner if the Cr film is in a flat film shape. Then, a post heat treatment is performed in a vacuum at 500° C. to 900° C. to further flatten the Cr film. In the case of Cr, the Cr film grows with a (001) plane on MgO.

Next, the iron-based alloy layer 4 is formed on the underlayer 3. This layer is the basis of the perpendicularly magnetized layer 7. The iron-based alloy layer 4 can be produced using a known technique for obtaining an alloy film. For example, direct current magnetron sputtering, radio frequency (RF) magnetron sputtering, electron beam deposition, resistance heating deposition, and the like can be used. As a raw material, in addition to a method for forming a film using an Fe—Al alloy of which the composition has been adjusted as a target, simultaneous film formation using a plurality of targets can be utilized. For example, simultaneous film formation using pure Fe and pure Al targets or simultaneous film formation using two targets having different Fe—Al compositions can be used. Moreover, this layer may be formed by utilizing an atomic alternate lamination technique in which an Fe layer and an Al layer having a thickness of about the atomic plane thickness (0.1 to 0.2 nm) are alternately stacked. The Fe—Al composition can be finely adjusted by combining the above techniques. The film thickness of the iron-based alloy layer 4 is about 0.5 to 1.5 nm, which is an ultrathin film shape suitable for obtaining perpendicular magnetization. The temperature during a growth may be room temperature, and the iron-based alloy layer 4 can be formed at a higher temperature if the iron-based alloy layer 4 can be obtained in a flat film shape. The crystal quality of the iron-based alloy layer 4 can be improved by performing the post heat treatment in a vacuum at about 100° C. to 200° C. thereafter. The iron-based alloy layer 4 may have a concentration gradient of Fe and Al in the out-of-plane direction.

Next, the first metal film 51 is first formed on the iron-based alloy layer 4 produced, and then the second alloy film 52 is formed. For this purpose, the Mg metal film 51 as the first metal film is formed in a film thickness in a range of 0 to about 0.6 nm by, for example, direct current magnetron sputtering. The Mg insertion layer contributes to the improvement of the crystal structure in the vicinity of the nonmagnetic layer interface. It should be noted that the Mg insertion layer is not necessarily required.

Subsequently, a Mg—Al alloy film as the second alloy film is formed in a thickness of 0.2 to 3 nm by, for example, RF magnetron sputtering. The composition of Mg—Al is, for example, $Mg_{20}Al_{80}$ and $Mg_{40}Al_{60}$, but all compositions can be used as long as the composition is in the range of $Mg_{1-x}Al_x$ (0<x≤1) since Mg—Al can be obtained as a cubic oxide (typically $MgAl_2O_4$) having a spinel structure or a structure in which cation sites of a spinel structure are disordered after oxidation. The second alloy film may have a composition gradient in the out-of-plane direction. Oxygen gas is introduced into the vacuum chamber at 0.1 to 10 Pa after the formation of Mg—Al layer and the Mg—Al layer is exposed to an oxygen atmosphere, which is called a natural oxidation method. A nonmagnetic layer 6 composed of crystalline $MgAl_2O_4$ is formed from the stacked structure 5 by the natural oxidation method. This change by the natural oxidation method corresponds to the layer change between FIG. 1 and FIG. 2.

Instead of the natural oxidation method, a method in which an oxide is obtained by controlling oxygen plasma between the sputtering cathode and the substrate in an oxygen gas atmosphere can also be used for the oxidation of Mg—Al layer. This technique is called a plasma oxidation method. As the plasma oxidation method, there are a direct plasma oxidation method in which a sample is directly exposed to oxygen plasma and an indirect plasma oxidation method in which a sample is not directly exposed to oxygen plasma by installing a shutter between the oxygen plasma and the sample. The former provides stronger oxidizing power. The oxidation time is about several seconds to one hour in the natural oxidation method and about one second to several minutes in the plasma oxidation method and is selected according to the desired oxidizing intensity.

In the nonmagnetic layer 6 ($MgAl_2O_4$), the Mg—Al composition varies depending on the composition of Mg—Al layer to be the basis, the thickness ratio between the Mg—Al layer and the Mg layer, and the amount of Al diffused from the iron-based alloy layer 4. This layer is not necessarily required to have an atomic ratio of Mg:Al:O=1:2:4, and thus this nonmagnetic layer 6 will be generally referred to as a Mg—Al—O layer hereinafter. The Mg—Al—O layer has a cubic spinel structure or a cubic structure in which cation sites of a spinel structure are disordered, and the Mg—Al—O (001) can be directly grown on the iron-based alloy layer (001). The lattice mismatch between the iron-based alloy and Mg—Al—O is at most 1% to 2%, and thus the crystal lattice matching property of these stacked films is extremely favorable.

The Mg—Al—O layer 6 can be formed in a high quality film shape even in the case of using either of the natural oxidation method or the plasma oxidation method by properly adjusting the oxidizing power according to the film thickness of Mg layer, the film thickness of Mg—Al layer, and the Mg—Al composition to be the basis. At the time of forming this layer, movement of a part of Al contained in the iron-based alloy layer may occur during the oxidation of Mg—Al layer. Strong perpendicular magnetization is induced at the interface between the iron-based alloy layer 4 and the Mg—Al—O layer 6 as the hybridization of electron orbits of each of the iron atoms occupying most of the iron-based alloy layer 4 and the oxygen atoms of the Mg—Al—O layer 6 effectively occurs. The iron-based alloy layer 4 maintains high lattice matching property with the Mg—Al—O layer 6, for example, even in a case in which the Al composition is changed by diffusion and the like.

The Mg—Al—O layer corresponding to the nonmagnetic layer 6 can be formed from an oxide target such as $MgAl_2O_4$ by a method using radio frequency (RF) magnetron sputter deposition. As the Mg—Al oxidation method, a radical oxidation method using oxygen radical and a technique such as promotion of oxidation by substrate heating can also be utilized. By performing a post heat treatment at about 100° C. to 600° C. after the formation of Mg—Al—O layer 6, the crystal quality can be improved, (001) orientation is improved, thus strong PMA is easily obtained, and a high TMR ratio can be obtained in the MTJ element.

Next, a method for manufacturing the perpendicular MTJ film 11 according to the embodiments of the present invention will be described with reference to FIG. 3. In the perpendicular MTJ film 11, the same manufacturing methods as those for the precursor structure 1 of a perpendicularly magnetized film structure and the perpendicularly magnetized film 101 described above can be used to produce the respective layers from the substrate 12 to the nonmagnetic layer 19. Hereinafter, a stacked film of pure Fe and a cobalt-iron-boron (Co—Fe—B) alloy will be described as an example of the second ferromagnetic layer 16. An Fe layer is produced on the stacked structure 15 by direct current magnetron sputtering, for example, at room temperature. Strong PMA between the Fe film and the stacked structure 15 (Mg—Al—O layer) can be obtained by setting the film thickness to a range of 0.02 nm to 0.5 nm. Next, a Co—Fe—B alloy layer is formed on the Fe layer in a film thickness range of 0.5 to 1.3 nm, for example, at room temperature by direct current magnetron sputtering. For example, $(Co_{1-x}Fe_x)_{80}B_{20}$ (0.2≤x≤1) can be utilized as the composition of Co—Fe—B. This second ferromagnetic layer 16 composed of Fe and Co—Fe—B alloy film can be converted to the second perpendicularly magnetized film 20 by being subjected to a heat treatment, for example in a range of 200° C. to 350° C. The protective film layer 17 is disposed on the second perpendicularly magnetized film 20 and can be formed, for example, by sputtering Ta and Ru in this order.

Next, a method for manufacturing the perpendicular MTJ element 21 according to the embodiments of the present invention will be described with reference to FIG. 4. The same technique as that for the perpendicular MTJ film 11 described above can be used to produce the respective layers from the substrate 22 to the protective film layer 27. Hereinafter, an example in which $SiO_2$ is used in the interlayer insulating film layer 30 and Au is used in the upper electrode 28 is described. In order to obtain the perpendicular MTJ element 21, a microfabrication technique is used. As an example of microfabrication method, a photoresist is placed on the protective film layer 27, and then the portion at which the element is formed is masked with the photoresist using a technique such as photolithography or electron beam lithography. Subsequently, an etching treatment is performed from the protective film layer 27 to a part of the underlayer (lower layer) 23 using an Ar ion etching apparatus or a reactive ion etching apparatus. Then, a $SiO_2$ layer 30 is formed on the etched portion by RF magnetron sputtering and the like, and the photoresist mask is lifted off. Next, the upper electrode 28 composed of Au 120 nm is formed on the upper part of the element. By appropriately forming a lower electrode composed of a metal such as Au so as to be in contact with the lower layer 23, the element can function as a perpendicular MTJ element.

Example 1

(C) Characteristics

Next, the perpendicularly magnetized film of the present embodiment will be explained in the following Examples with reference to FIG. 6 and FIG. 7.

As the perpendicularly magnetized film structure, an example in which a multilayer film having a structure of MgO (001) single crystal substrate/Cr (40 nm)/iron-based alloy layer Fe—Al ($t_{FeAl}$)/Mg (0.2 nm)/Mg—Al ($t_{MgAl}$)-indirect plasma oxidation/Ru (2 nm) is formed by sputter deposition and plasma oxidation will be described. Here, $t_{FeAl}$ is the iron-based alloy layer (Fe—Al) film thickness and $t_{MgAl}$ is the Mg—Al film thickness. The MgO single crystal substrate was washed with an organic solvent and ultrapure water, then introduced into a vacuum chamber, and heated at 600° C. to obtain a clean crystal plane. Thereafter, the substrate was cooled to room temperature, and then the respective layers were formed using a 2-inch magnetron sputtering apparatus. For the formation of Fe—Al layer, simultaneous sputtering was performed using two targets of pure Fe and pure Al. The composition was adjusted by changing each input power using a direct current power source for the pure Fe target and an RF power source for the pure Al target. The Fe—Al composition was $Fe_{72}Al_{28}$, and the Mg—Al composition was $Mg_{40}Al_{60}$. These compositions are values identified by radio frequency inductively coupled plasma atomic emission spectroscopy. The multilayer film was annealed in a vacuum in a temperature range of $T_{ex}$=200° C. to 350° C. to improve the characteristics. As the conditions for indirect plasma oxidation, gas in which oxygen 5 Pa and Ar 1 Pa were mixed was used, and the RF power applied to the 2-inch target was 7 W. The oxidation time was set to 50 s.

Figure 6:
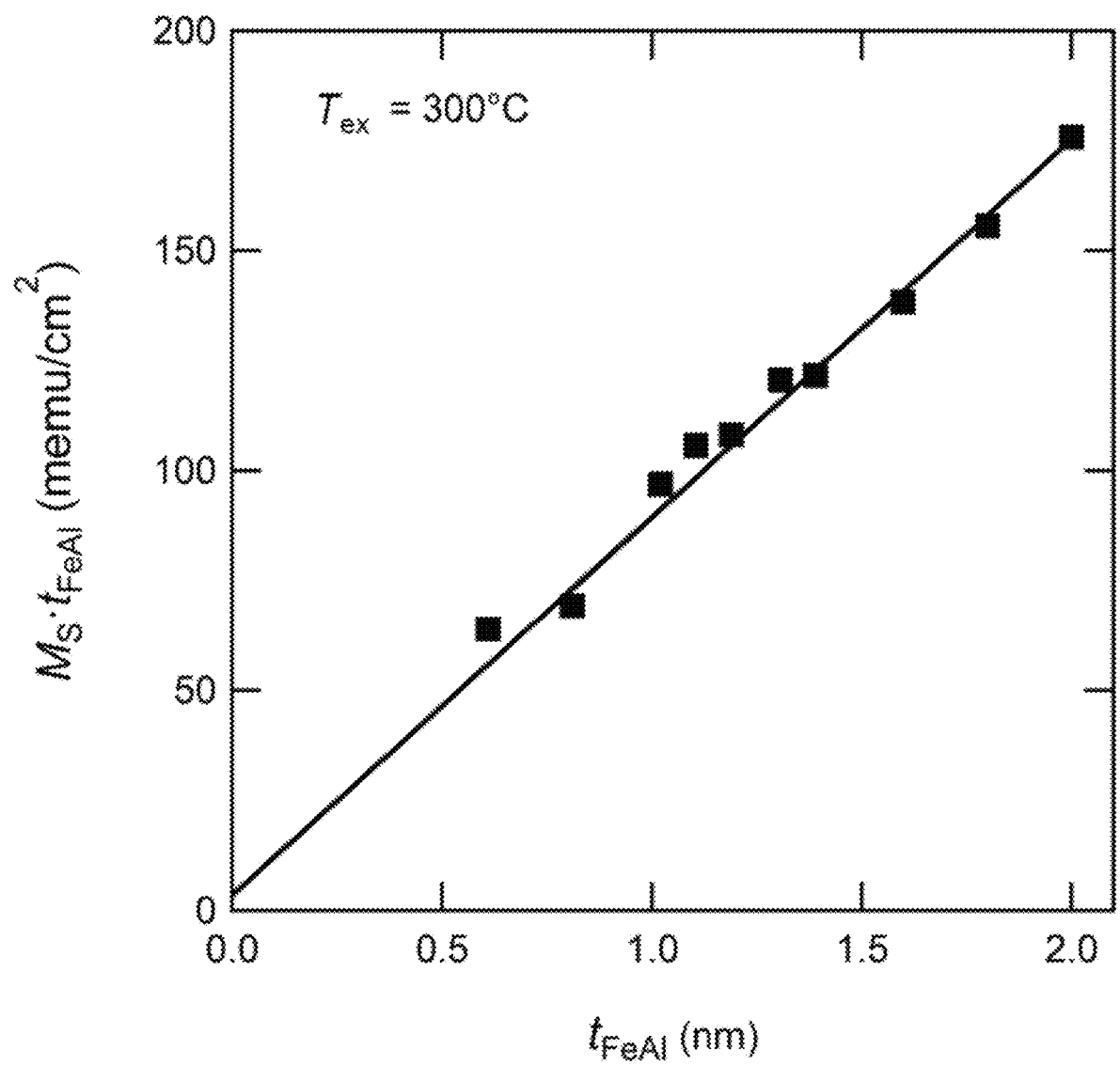
FIG. 6 is a graph illustrating the relation of the saturation magnetization per area (Ms·t$_{FeAl}$) with the FeAl film thickness (t$_{FeAl}$) in the perpendicularly magnetized film structure of FIG. 2 and illustrates the results in t$_{FeAl}$=0.8 to 2.0 nm at a heat treatment temperature (T$_{ex}$) of 300° C.
Figure 7:
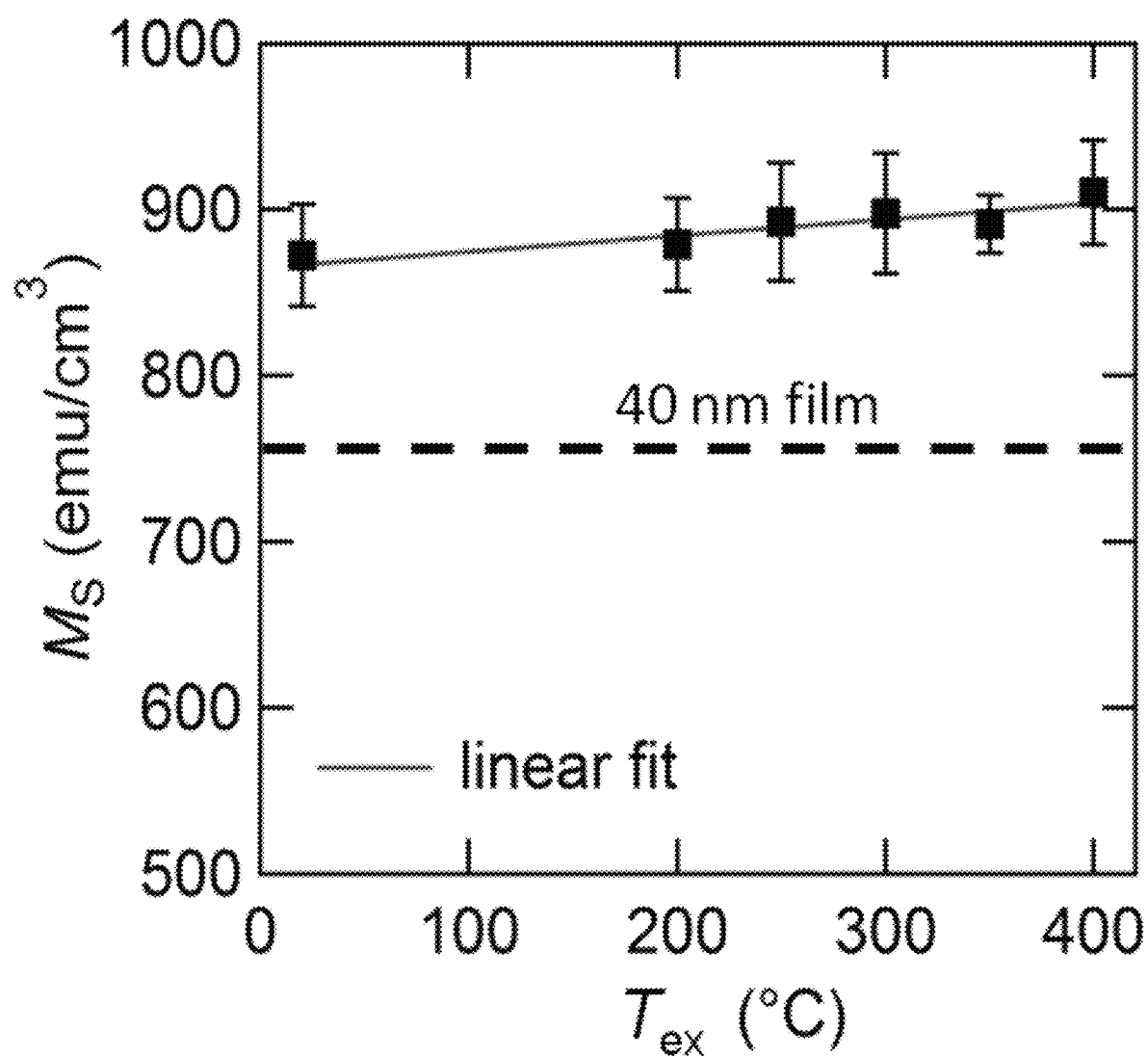
FIG. 7 is a diagram illustrating the T$_{ex}$ dependency of saturation magnetization Ms in the perpendicularly magnetized film structure of FIG. 2.

FIG. 6 is a plot of the product of saturation magnetization Ms and $t_{FeAl}$ (Ms·$t_{FeAl}$) versus $t_{FeAl}$ in a perpendicularly magnetized film structure produced by setting $t_{MgAl}$=0.7 nm. Ms·$t_{FeAl}$ is the saturation magnetization per unit area. In FIG. 6, the results at $T_{ex}$ of 300° C. is illustrated as a representative and the straight line is the result of linear fitting. From this figure, it is found that Ms·$t_{FeAl}$ is approximately proportional $t_{FeAl}$ and the intercept is approximately zero. Hence, it means that a portion at which the magnetization of Fe—Al is decreased, namely, a magnetic dead layer, is hardly present at the interface between the Cr layer of the underlayer and the Mg—Al—O layer. This suggests that the lattice mismatch between the respective layers of Cr, Fe—Al, and Mg—Al—O layers is small and an interface having smooth and high crystal quality is obtained. The average Ms at each $T_{ex}$ can be calculated from the slope of this linear fitting. FIG. 7 illustrates the $T_{ex}$ dependency of the calculated Ms. As Comparative Example, the Ms value of an $Fe_{72}Al_{28}$ film having a thickness of 40 nm is illustrated by a dotted line. From this figure, it can be seen that the Ms of the $Fe_{72}Al_{28}$ ultrathin film slightly increases as $T_{ex}$ increases but is generally in a narrow range of 880 to 910 emu/cm³. This moderate increase in Ms indicates an improvement in crystal quality at $T_{ex}$. On the other hand, Ms is clearly greater than about 750 emu/cm³ which is the Ms value of a film having a thickness of 40 nm. As explained in Example 2, it is suggested that the Al composition in the Fe—Al layer is decreased from the original $Fe_{72}Al_{28}$ and is changed to a composition of roughly about $Fe_{77}Al_{23}$.

Figure 8:
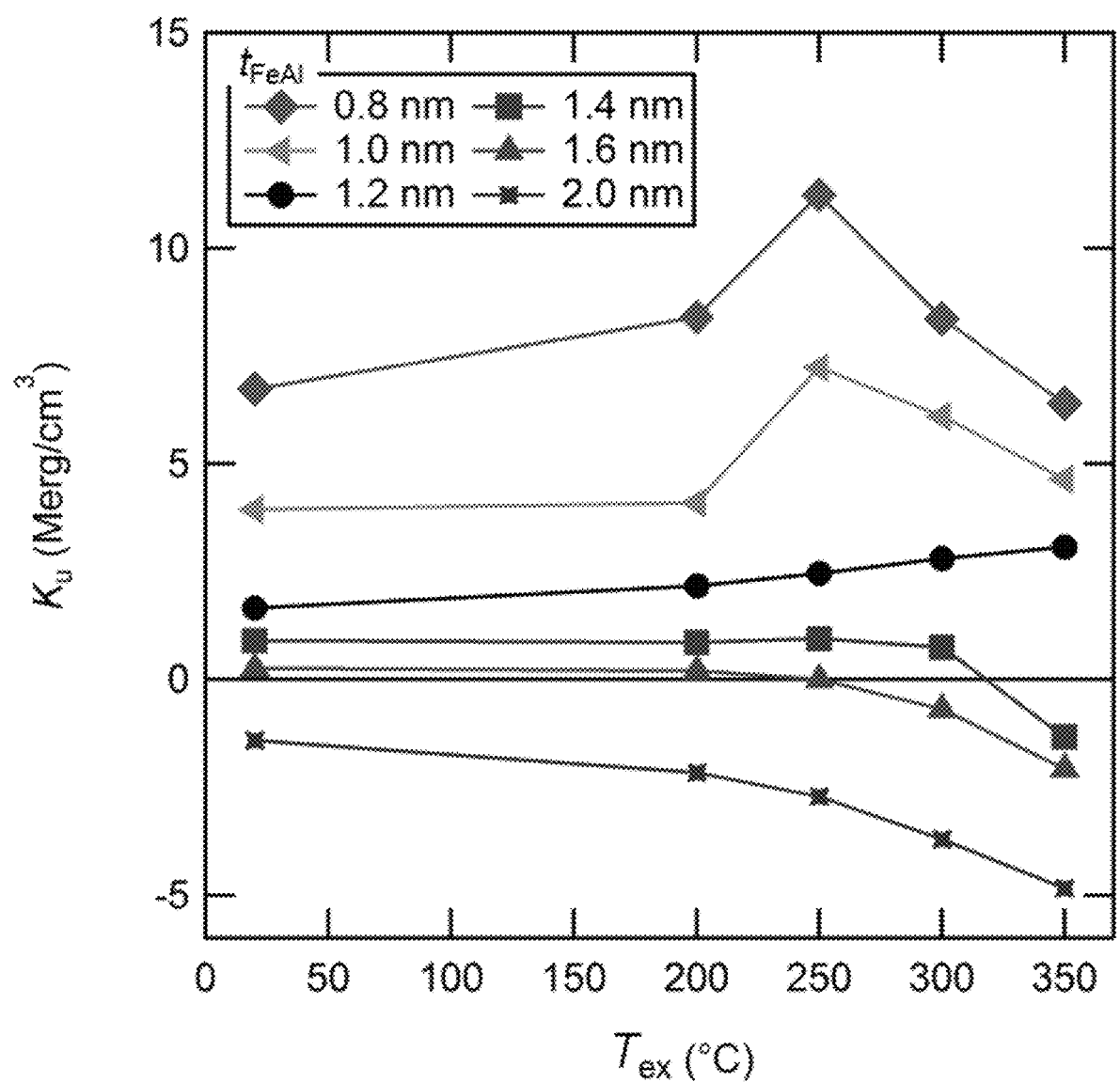
FIG. 8 is a graph illustrating the dependency of the magnitude Ku of perpendicular magnetic anisotropy on the Fe$_{72}$Al$_{28}$ film thickness (t$_{FeAl}$) and T$_{ex}$ in the case of setting the second alloy layer film thickness t$_{MgAl}$=0.7 nm in the perpendicularly magnetized film structure of FIG. 2.

FIG. 8 is a graph illustrating the dependency of the magnitude Ku of perpendicular magnetic anisotropy on the $Fe_{72}Al_{28}$ film thickness ($t_{FeAl}$) and $T_{ex}$ in the perpendicularly magnetized film structure having $t_{MgAl}$=0.7 nm. The magnitude Ku of perpendicular magnetic anisotropy was calculated from the relation Ku=Hk×Ms/2 using the in-plane direction anisotropic magnetic field Hk and saturation magnetization Ms obtained from the measured magnetization curve. Positive Ku indicates that the film is a perpendicularly magnetized film, and negative Ku indicates that the film is an in-plane magnetization film. FIG. 8 illustrates the results of calculated Ku in $t_{FeAl}$=0.8 to 2.0 nm at $T_{ex}$=200° C. to 350° C. In addition, as Comparative Example, the result before (As-depo, $T_{ex}$=20° C.) a heat treatment is also illustrated. In As-depo, it can be seen that a perpendicularly magnetized film is obtained in $t_{FeAl}$≤1.6 nm. Hence, it is indicated that perpendicular magnetization can be obtained even without performing a heat treatment in the Fe—Al/Mg—Al—O structure. In addition, a remarkable increase in Ku is observed in $t_{FeAl}$≤1.2 nm as $T_{ex}$ increases. In particular, Ku had a maximum value of 7 Merg/cm³ (0.7 MJ/m³) under the conditions of $t_{FeAl}$=1.0 nm and $T_{ex}$=250° C., for example. This maximum value is about 1.7 times the maximum value 4 Merg/cm³ (0.4 MJ/m³) in a case in which $Co_2FeAl$ is used instead of the iron-based alloy layer and the film thickness is 1.0 nm as disclosed in Patent Literature 4. Furthermore, perpendicular magnetization can be maintained even at $T_{ex}$=350° C. in $t_{FeAl}$≤1.2 nm, and the heat resistance is more favorable than that in the case of using $Co_2FeAl$.

Figure 9:
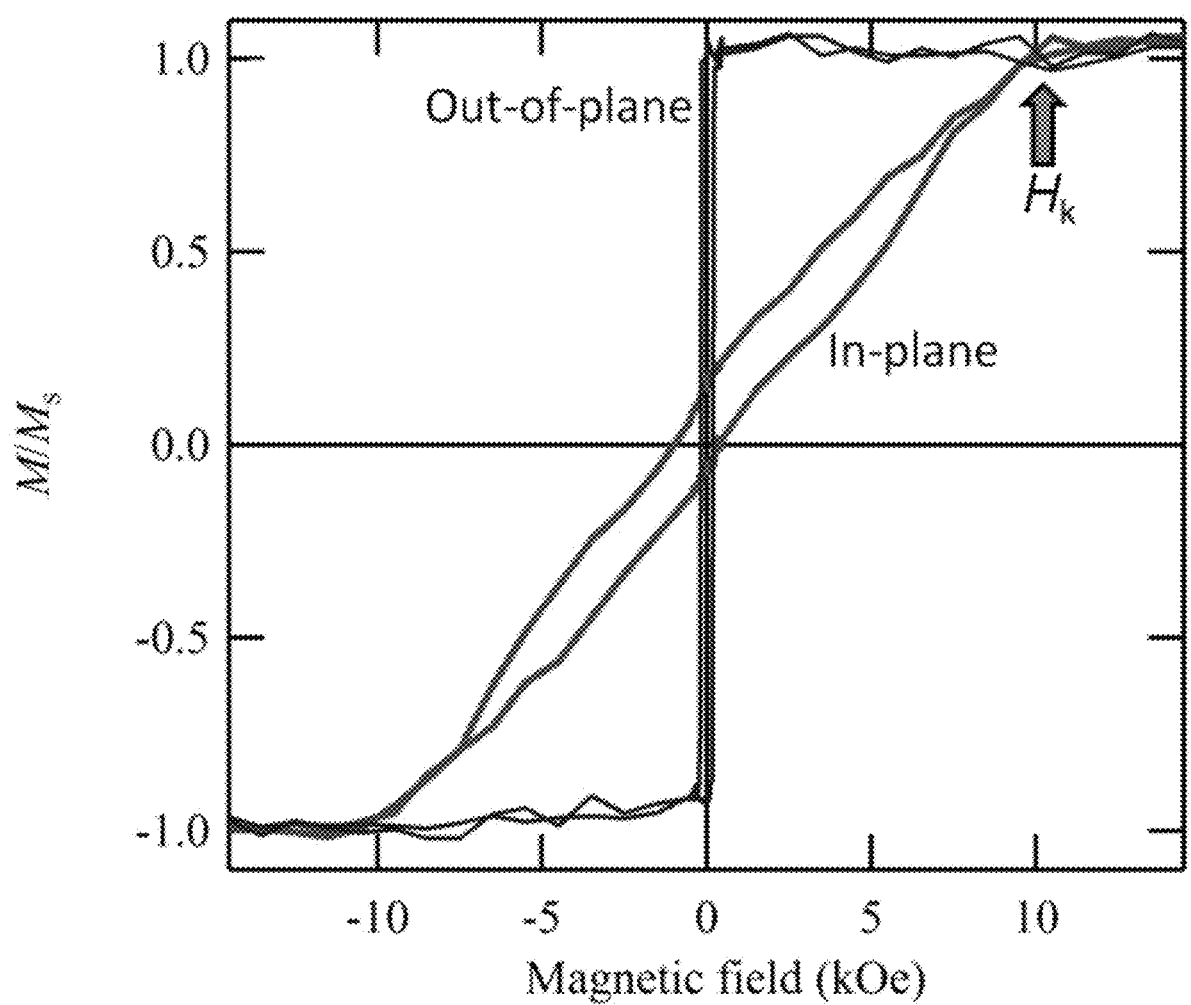
FIG. 9 is a diagram illustrating an example of a magnetization curves in the case of an Al composition x=27.9% and T$_{ex}$=200° C. in the perpendicularly magnetized film structure of FIG. 2.

FIG. 9 is a diagram illustrating an example of the magnetization curves in the perpendicularly magnetized film structure of FIG. 2. In FIG. 9, measurement was performed in $t_{FeAl}$=1.0 nm, $t_{MgAl}$=0.7 nm at $T_{ex}$=200° C. by applying an external magnetic field in the in-plane direction and the out-of-plane direction. In addition, the magnitude (M) of magnetization is normalized by the value (Ms) of saturation magnetization. When an external magnetic field is applied in the out-of-plane direction, an aspect is observed that the magnetization is easily reversed and the magnetization is saturated in a low magnetic field. On the other hand, when an external magnetic field is applied in the in-plane direction, magnetization hardly occurs, and this direction is a hard direction of magnetization. As indicated by an arrow in FIG. 9, the anisotropic magnetic field Hk of this perpendicularly magnetized film structure is about 10 kOe. Hence, it is indicated that this multi layer film structure is a perpendicularly magnetized film having an easy axis direction of magnetization in the out-of-plane direction.

Example 2

Next, with regard to the perpendicularly magnetized film of the present embodiment, an example is described in which an $Fe_{100-x}Al_x$ layer having a film thickness of 1 nm is used as the iron-based alloy layer 4 of the perpendicularly magnetized film structure of FIG. 2. The atomic ratios used in this example are x=11.0, 19.6, and 27.9 (composition in Example 1: $Fe_{72}Al_{28}$). With regard to the second alloy film 52, the film thickness was 0.7 nm and the Mg—Al composition was $Mg_{40}Al_{60}$. By the indirect plasma oxidation method, the first metal layer Mg and the second alloy film 52 are oxidized into a Mg—Al—O layer, and $MgAl_2O_4$ is preferably adopted as the degree of oxidation.

Figure 10:
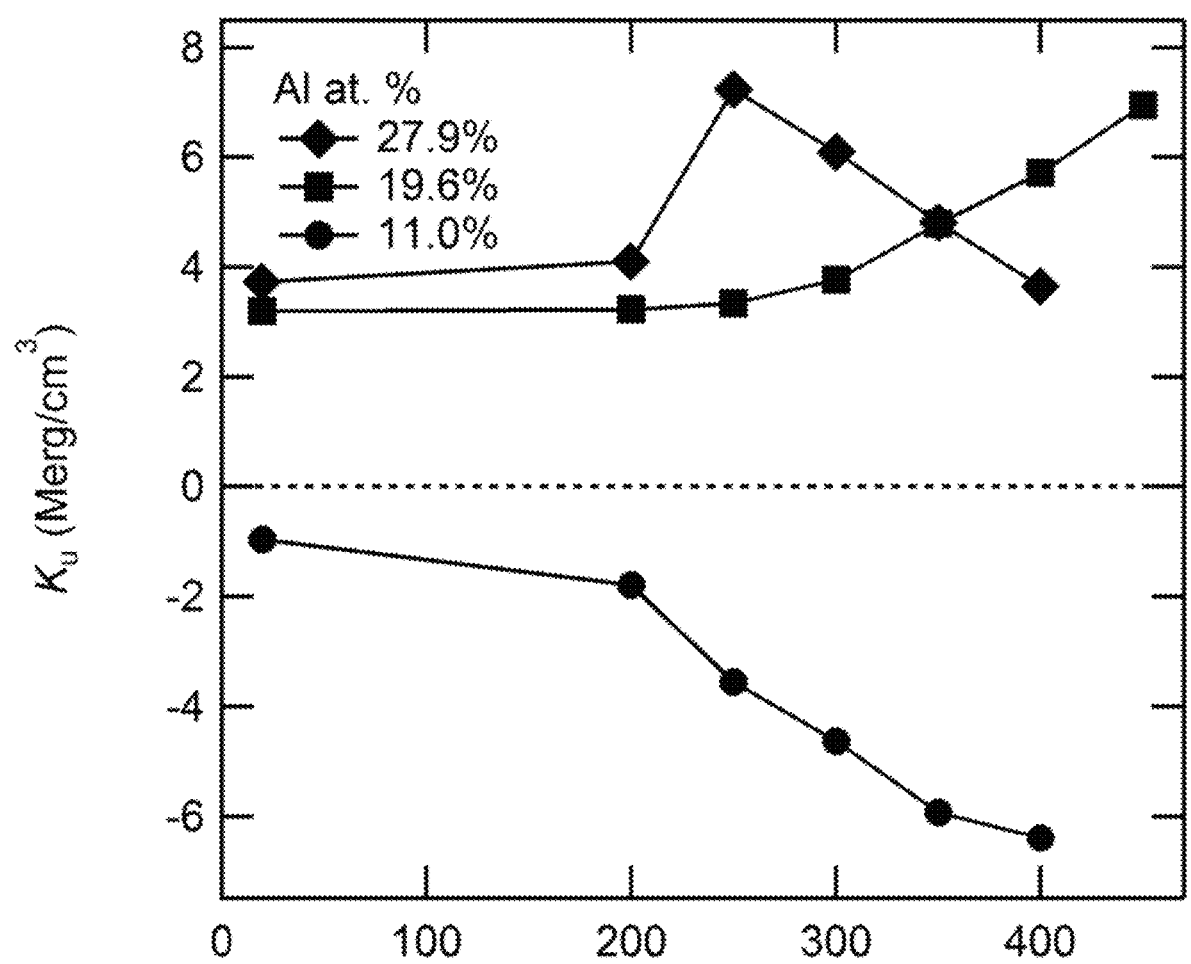
FIG. 10 is a graph illustrating the dependency of the magnitude Ku of perpendicular magnetic anisotropy on the Al composition and heat treatment temperature T$_{ex}$ in the perpendicularly magnetized film structure of FIG. 2.

FIG. 10 is a graph illustrating the dependency of the magnitude Ku of perpendicular magnetic anisotropy on the annealing heat treatment temperature $T_{ex}$. At high $T_{ex}$ (=450° C.), a high Ku is realized at a composition of x=19.6% and the heat resistance is significantly favorable. In contrast, at the composition of x=11.0%, the saturation magnetization Ms is higher and thus the in-plane magnetization remains as it is at any $T_{ex}$. In other words, the characteristics of the perpendicularly magnetized film can be designed by adjusting the Al composition. Moreover, in the composition of x=27.9%, the maximum value of Ku is obtained at $T_{ex}$ (=250° C.) and Ku decreases when $T_{ex}$ exceeds 250° C.

Figure 11:
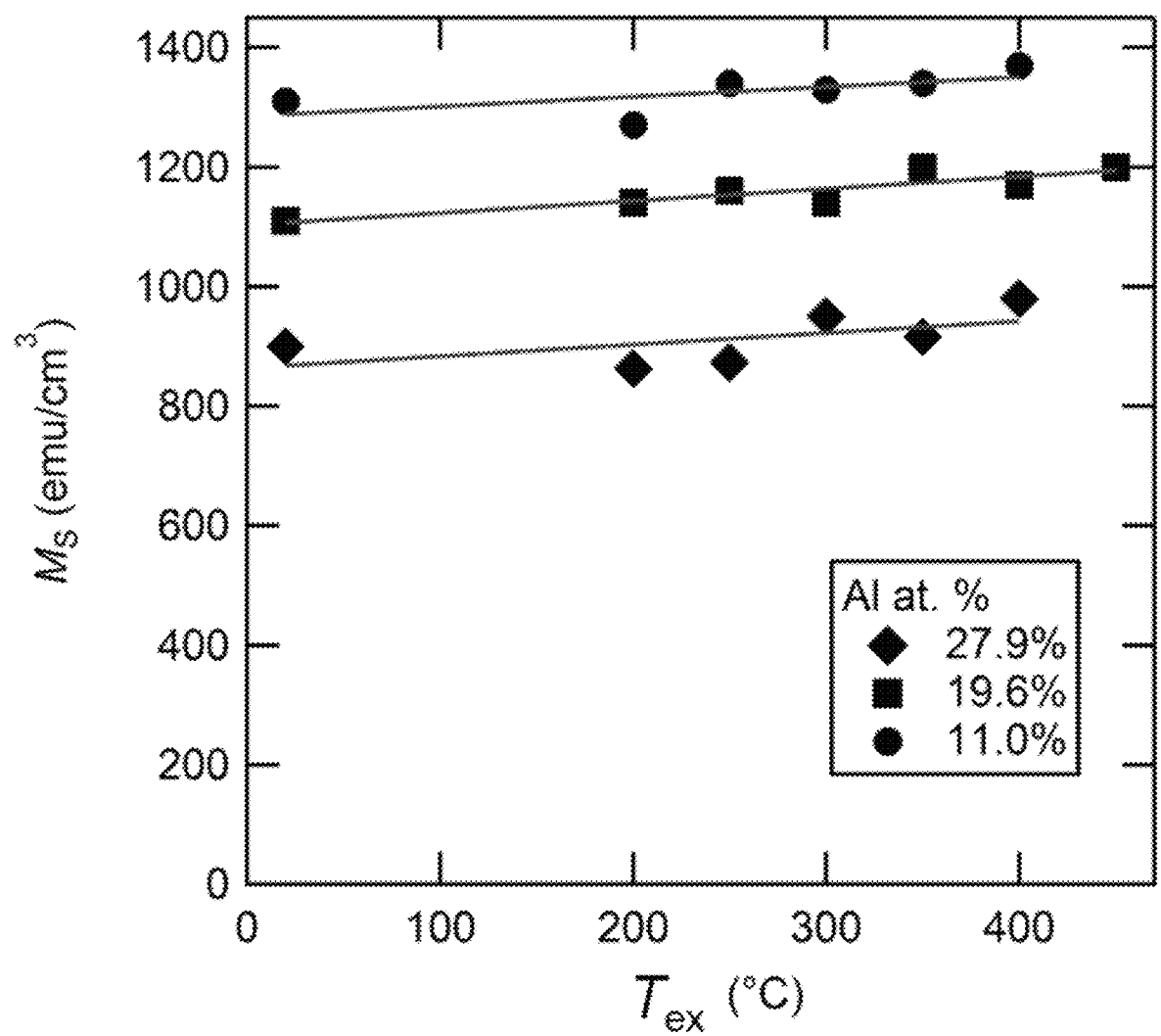
FIG. 11 is a graph illustrating the dependency of saturation magnetization Ms on the Al composition and T$_{ex}$ in the perpendicularly magnetized film structure of FIG. 2.

FIG. 11 is a graph illustrating the $T_{ex}$ dependency of the saturation magnetization Ms. The solid line indicates the result of linear fitting, and three types of x=11.0% composition, 19.6% composition, and 27.9% composition are presented. The tendency that Ms monotonously decreases with respect to the increase in Al composition ratio x is the same as that in bulk Fe—Al. In addition, Ms slightly increases by a heat treatment but is stable even though the film thickness is 1 nm to be significantly thin.

Figure 12:
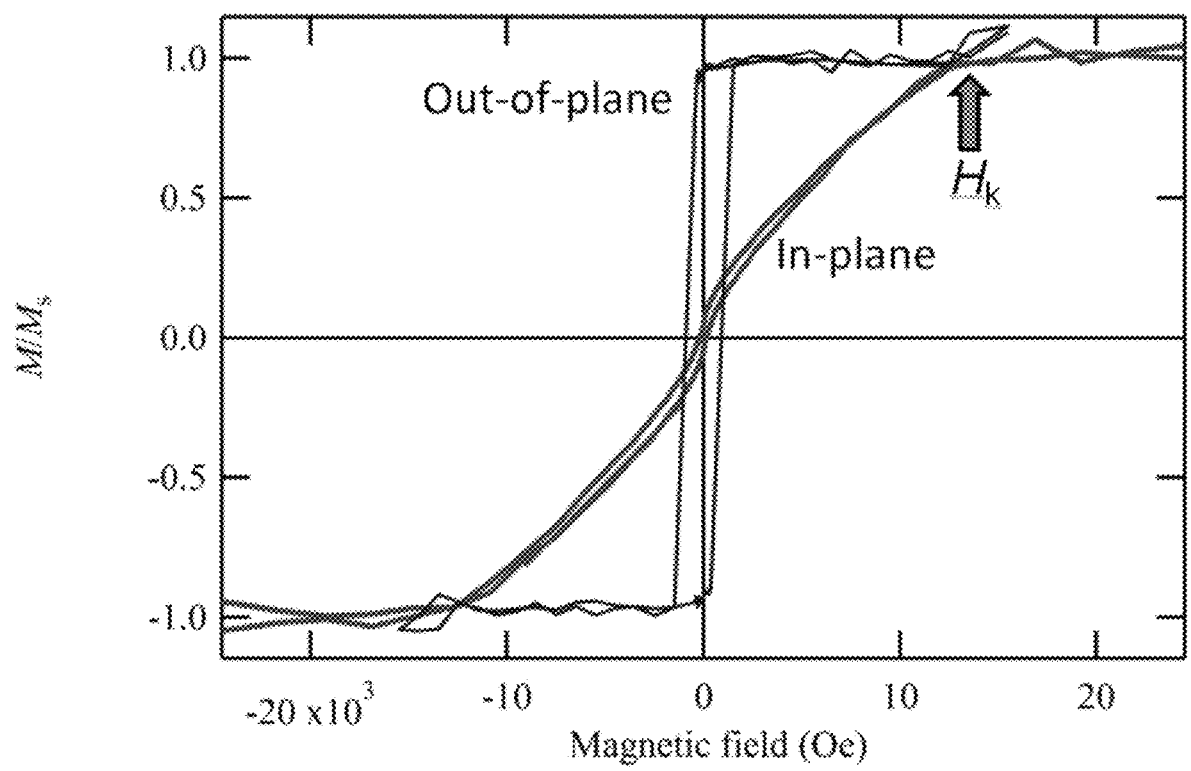
FIG. 12 is a diagram illustrating an example of a magnetization curves in the case of an Al composition x=19.6% and T$_{ex}$=450° C. in the perpendicularly magnetized film structure of FIG. 2.

FIG. 12 is a diagram illustrating an example of the magnetization curves in the case of x=19.6% composition and $T_{ex}$=450° C. Significantly strong PMA is obtained and the shape of magnetization curve is also favorable (the in-plane magnetization curve is closed). In other words, there is little non-uniformity in the film. Moreover, as indicated by an arrow in FIG. 12, the anisotropic magnetic field Hk of this perpendicularly magnetized film structure is about 13 kOe. Hence, PMA and heat resistance can be further improved by designing the Fe—Al composition.

Figure 13:
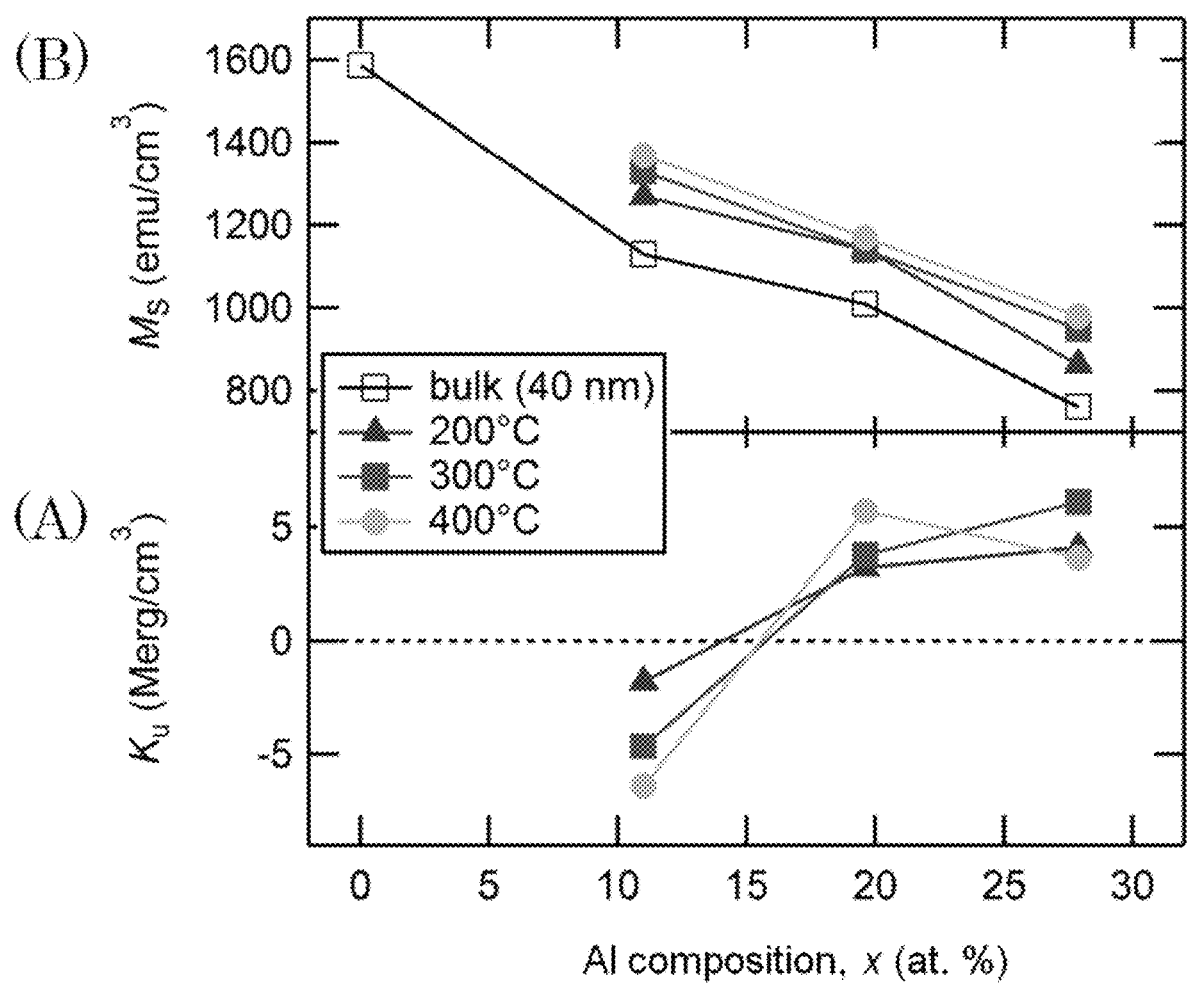
FIG. 13(A) is a graph illustrating the Al composition x dependency of the magnitude Ku of magnetic anisotropy and FIG. 13(B) is a graph illustrating the Al composition x dependency of the saturation magnetization Ms, in the perpendicularly magnetized film structure of FIG. 2.

FIG. 13(A) is a graph illustrating the Al composition ratio x dependency of the magnitude Ku of magnetic anisotropy and FIG. 13(B) is a graph illustrating the Al composition ratio x dependency of the saturation magnetization Ms. The Ms decrease behavior with respect to the increase in Al composition ratio x is the same for both an ultrathin film and a thick film (bulk), but the ultrathin film has a higher Ms. In other words, it is considered that about several percent of Al in the Fe—Al layer diffuses to the Mg—Al—O layer side and, as a result, an Fe-rich composition is obtained as compared to the original Fe—Al ratio.

In the low annealing heat treatment temperature $T_{ex}$ region, a higher Ku is obtained at the Al-rich composition (x=27.9%) than at other compositions. On the other hand, a higher Ku is obtained at a composition of x=19.6% at a higher $T_{ex}$ (for example, 350° C. or more). From the above, it can be seen that a perpendicularly magnetized film can be designed in a wide range by adjusting the Fe—Al composition, the Fe—Al film thickness, and the heat treatment temperature.

Example 3

Next, an example of the perpendicular MTJ film and perpendicular MTJ element according to an embodiment of the present invention will be described with reference to FIG. 14 and FIG. 15. As the MTJ film, a multilayer film having a structure of MgO (001) single crystal substrate/Cr (40 nm)/iron-based alloy layer Fe—Al (1 nm)/Mg (0.2 nm)/Mg—Al ($t_{MgAl}$)-indirect plasma oxidation/Fe (0.1 nm)/Co—Fe—B (1.4 nm)/Ta (2 nm)/Ru (8 nm) was formed by sputter deposition and plasma oxidation. Here, $t_{MgAl}$ is the Mg—Al film thickness. The Fe—Al composition was $Fe_{72}Al_{28}$, and the Mg—Al composition was $Mg_{40}Al_{60}$. In addition, the Mg/Mg—Al layer is converted to a Mg—Al—O layer by indirect plasma oxidation. In this perpendicular MTJ film, the same method as that for the perpendicularly magnetized film structure of Example 1 was used as the manufacturing method from the MgO substrate to the Mg—Al—O layer.

The Mg—Al—O layer was post-annealed in a vacuum chamber at 250° C. for 15 minutes to improve crystallinity and secure flatness. Thereafter, an Fe layer and a Co—Fe—B layer were formed in this order at room temperature by direct current magnetron sputtering. The target composition of the used Co—Fe—B alloy is $Co_{40}Fe_{40}B_{20}$.

In this Example, a two-layer structure of Ta/Ru was used as the protective film layer. This protective film layer also has a function as an upper electrode when an element is produced. The Ta layer and the Ru layer were both formed by sputter deposition.

Next, the perpendicular MTJ film was taken out from the sputtering chamber and then was processed into a perpendicular MTJ element by a microfabrication technique using a photolithography apparatus, an argon ion etching apparatus, and a lift-off method. The element size was 10×5 µm², the element had an elliptical shape, and $SiO_2$ (30 nm) as an interlayer insulating film was formed in the vicinity of the element by sputtering. A two-layer film of Ta (3 nm)/Au (120 nm) as an upper electrode and a lower electrode was formed by sputtering.

The perpendicular MTJ element produced was subjected to a heat treatment in a temperature range of $T_{ex}$=200° C. to 350° C. for 30 minutes using a vacuum heat treatment furnace. Subsequently, a magnetic field was applied in the direction perpendicular to the film at room temperature, and the element resistance change (TMR ratio)-magnetic field curve (TMR-H curve) was measured.

Figure 14:
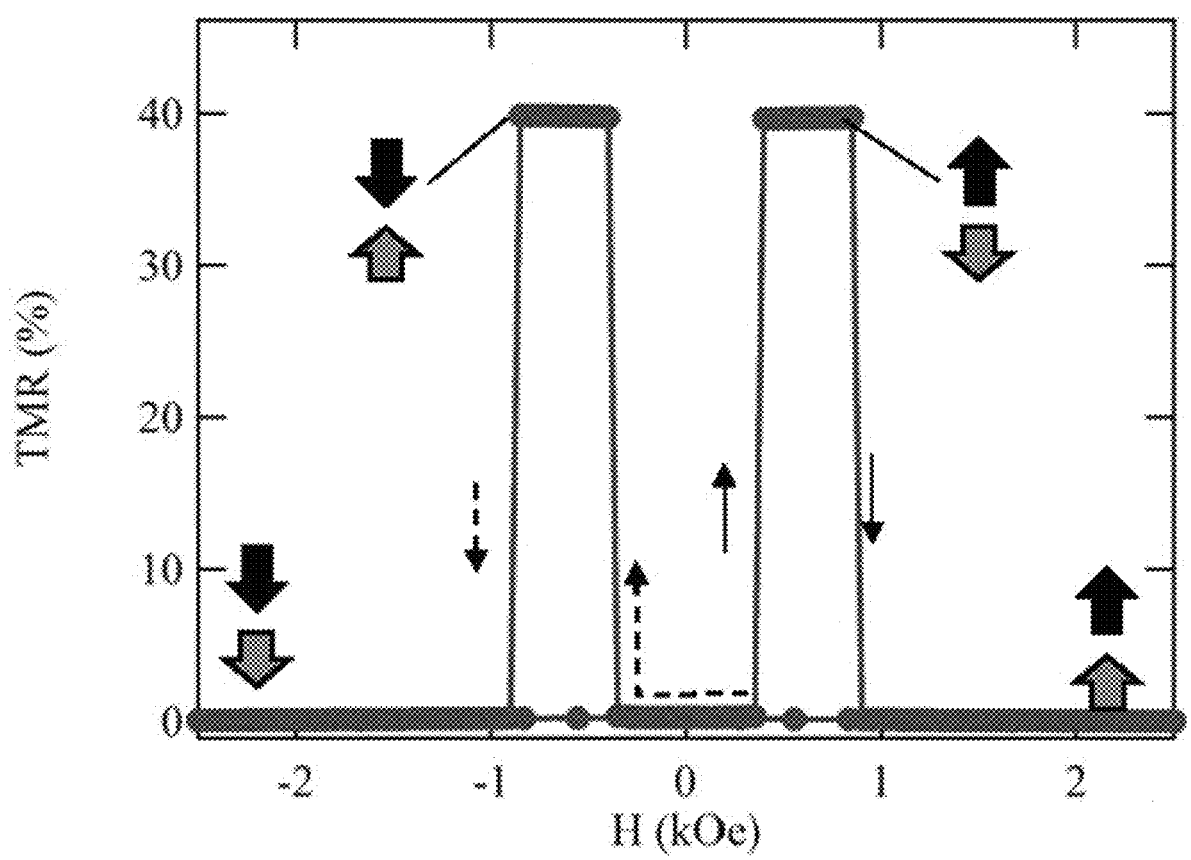
FIG. 14 is a graph illustrating TMR ratio-magnetic field (H) curve at T$_{ex}$=350° C. of the perpendicular MTJ element of FIG. 4 produced using t$_{MgAl}$=0.28 nm.

FIG. 14 is a graph illustrating the TMR-H curve at the optimum $T_{ex}$ of the perpendicular MTJ element produced using $t_{MgAl}$=0.28 nm. The thick arrows in FIG. 14 indicate the magnetization directions of the first perpendicularly magnetized film 24 (lower side) and the second perpendicularly magnetized film 26 (upper side). From this figure, it can be seen that the angulation of the curve is significantly favorable and the parallel magnetization arrangement and the antiparallel magnetization arrangement can be clearly distinguished from each other by the magnetic field sweep. The optimum $T_{ex}$ is, for example, 350° C., and a TMR ratio of 40% is obtained at this condition. Here, the TMR ratio (%) was defined as $100 \times (R_{AP}-R_P)/R_P$ using the element resistance $R_P$ at the time of parallel magnetization arrangement and the element resistance $R_{AP}$ at the time of antiparallel magnetization arrangement.

Figure 15:
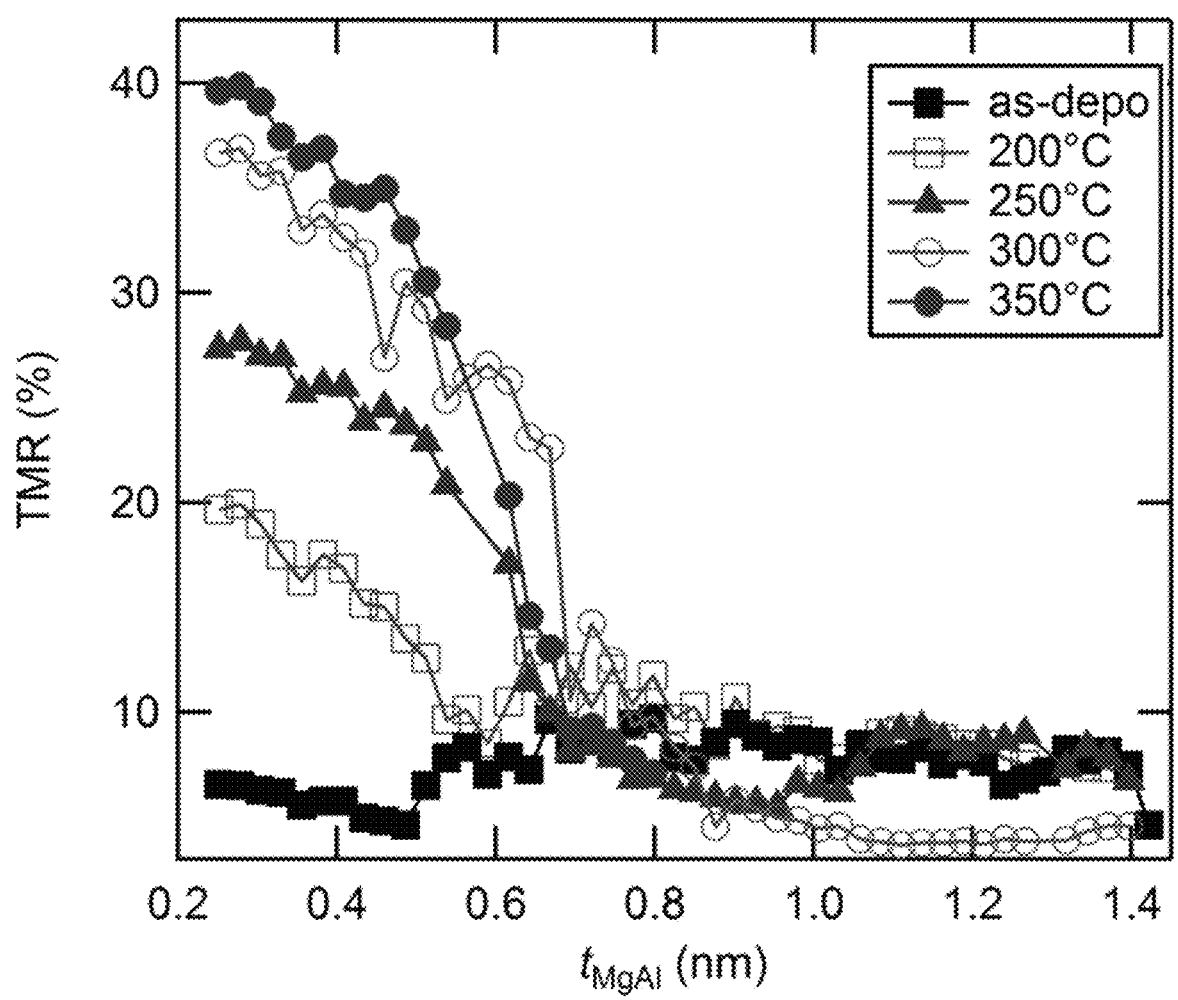
FIG. 15 is a graph illustrating the relation of TMR ratio with t$_{MgAl}$ and T$_{ex}$ in the perpendicular MTJ element of FIG. 4.

FIG. 15 is a graph illustrating the relation of TMR ratio with $t_{MgAl}$ and $T_{ex}$ in the perpendicular MTJ element. $T_{ex}$ is measured at an interval of 50° C. from 200° C. to 350° C. As Comparative Example, the result of a sample (As-depo) which is not subjected to a heat treatment is also illustrated. In As-depo, the second perpendicularly magnetized film 26 (Fe/Co—Fe—B) is not a complete perpendicularly magnetized film, and the TMR ratio is thus small. On the other hand, an increase in TMR is observed as the temperature approaches the optimum $T_{ex}$. Moreover, a greater TMR ratio is obtained in a region in which $t_{MgAl}$ is small (for example, $t_{MgAl} \leq 0.5$ nm) than in a region in which $t_{MgAl}$ is large. This is because PMA decreases as $t_{MgAl}$ increases. In the region in which $t_{MgAl}$ is large, the relative oxidizing intensity is low, and thus the fact that unoxidized Mg and Mg—Al remain is considered as a cause of this decrease in PMA. Hence, the magnitude of PMA can be optimally maintained by adjusting the oxidizing intensity at the time of Mg—Al—O layer fabrication.

It should be construed that the present invention is not limited to the above-described embodiments and includes various modified Examples within the obvious range for those skilled in the art. For example, the above described film thickness is merely an example, and an appropriate film thickness can be adopted so as to conform to the specifications of spintronic devices such as perpendicular MTJ elements. As the temperature, vacuum pressure, and heat treatment time in the manufacturing process as well, appropriate values can be adopted so as to conform to the manufacturing yield of spintronic devices such as perpendicular MTJ elements.

INDUSTRIAL APPLICABILITY

The perpendicularly magnetized film according to the present invention can be applied to a spintronic device, for example, can be utilized in a ferromagnetic layer for a perpendicular MTJ element of a high density spin transfer torque writing type MRAM or a voltage torque writing type MRAM. Moreover, the perpendicularly magnetized film can be utilized as a highly accurate and ultra-small magnetic sensor.

The method for manufacturing a perpendicularly magnetized film of the present invention can be utilized in the manufacturing process of spintronic devices such as perpendicular MTJ elements since the perpendicularly magnetized film in the method has a combined structure of an Fe-based alloy and Mg—Al oxide and thus the manufacturing process is simplified as well as the manufacturing conditions have a relatively wide permissible range.

REFERENCE SIGNS LIST

1 Precursor structure of perpendicularly magnetized film
101 Perpendicularly magnetized film structure
11 Perpendicular magnetization-type magnetic tunnel junction film (perpendicular MTJ film)
21 Perpendicular magnetization-type magnetic tunnel junction element (perpendicular MTJ element)
2, 12, 22 Substrate
3, 13, 23 Underlayer
4, 14, 24 Iron-based alloy layer
5, 15 Stacked structure
51, 151 First metal film (Mg)
52, 152 Second alloy film (Mg—Al)
6 Nonmagnetic layer (Mg—Al—O layer)
7 Perpendicularly magnetized layer
8, 17, 27 Protective film layer (Ta/Ru stacked film)
16 Second ferromagnetic layer
18, 24 First perpendicularly magnetized layer
19, 25 Nonmagnetic layer (tunnel barrier layer)
20, 26 Second perpendicularly magnetized layer
28 Upper electrode
30 Interlayer insulating film layer

The invention claimed is:

1. A precursor structure of a perpendicularly magnetized film comprising
a single-crystalline substrate having a cubic system structure having a (001) plane or a substrate having a layer having a cubic system structure or tetragonal system structure having a (001) plane,
an underlayer disposed on the substrate,
wherein the underlayer is composed of a conductive material having a good electric conductivity,
an iron-based alloy layer disposed on the underlayer,
wherein the iron-based alloy layer is a layer composed of an iron-based alloy comprising aluminum,
a first metal film disposed on the iron-based alloy layer,
wherein the first metal film is composed of a predetermined metal element, and
wherein the first metal film does not contain aluminum, and
a second alloy film disposed on the first metal film,
wherein the second metal film is composed of a predetermined alloy element, and
wherein the second metal film contains aluminum,
wherein the predetermined metal element is a metal element constituting an oxide having a spinel structure, and
wherein the predetermined alloy element is converted to an oxide having a spinel structure or an oxide having a structure in which a cation site of a spinel structure is disordered, when the alloy element is oxidized.

2. The precursor structure of a perpendicularly magnetized film according to claim 1, wherein the iron-based alloy layer is represented by an $Fe_{100-x}M_x$ layer, where M is one or more elements selected from the group consisting of Al, Si, Ga, and Ge, and $0<x<40$.

3. A perpendicularly magnetized film structure produced using the precursor structure of a perpendicularly magnetized film according to claim 1, the perpendicularly magnetized film structure comprising
a first perpendicularly magnetized layer consisting of an oxidation-treated iron-based alloy layer, the oxidation-treated iron-based ally layer comprising aluminum, and
a nonmagnetic layer consisting of an oxide of a first metal film and a second alloy film,
wherein the first metal film is composed of a predetermined metal element and does not contain aluminum, and
wherein the second metal film is composed of a predetermined alloy element and contains aluminum.

4. The perpendicularly magnetized film structure according to claim 3, wherein the nonmagnetic layer is a $Mg_{1-y}Al_y$—$O_x$ layer ($0<y\leq1$), ($0.8\leq x\leq1.7$) of a crystal substance.

5. A magnetoresistive random access magnetic memory (MRAM), a spin transfer torque writing type MRAM, a voltage torque writing type MRAM, or a magnetic disk device comprising a perpendicularly magnetized film structure according to claim 3.

6. A method of using a perpendicularly magnetized film structure according to claim 3 for at least one of a magnetoresistive random access magnetic memory (MRAM), a spin transfer torque writing type MRAM, a voltage torque writing type MRAM, or a magnetic disk device.

7. A perpendicular magnetization-type magnetic tunnel junction element comprising
a single-crystalline substrate having a cubic system structure having a (001) plane or a substrate having a layer having a cubic system structure or tetragonal system structure having a (001) plane, an underlayer disposed on the substrate,
wherein the underlayer is composed of a conductive material having a good electric conductivity,
an iron-based alloy layer disposed on the underlayer or a first perpendicularly magnetized layer consisting of an oxidation-treated iron-based alloy layer,
wherein the iron-based alloy layer or the oxidation-treated iron-based layer is a layer composed of an iron-based alloy comprising aluminum,
a tunnel barrier layer produced using a stacked structure of a first metal film and a second alloy film,
wherein the first metal film is disposed on the iron-based alloy layer or the first perpendicularly magnetized layer, the first metal film is composed of a predetermined metal element, and the first metal film does not contain aluminum, and
wherein the second alloy film is disposed on the first metal film, the second metal film is composed of a predetermined alloy element, and the second metal film contains aluminum,
a second ferromagnetic layer disposed on the tunnel barrier layer or a second perpendicularly magnetized layer consisting of an oxidation-treated second ferromagnetic layer,
wherein the second ferromagnetic layer or the oxidation-treated second ferromagnetic layer is composed of a ferromagnetic material selected from the group consisting of a cobalt-iron alloy, a cobalt-iron-boron alloy, a manganese-gallium alloy, a manganese-germanium alloy, and an alloy of one or more elements selected from the group consisting of iron and cobalt and one or more elements selected from the group consisting of platinum and palladium.

8. A magnetoresistive random access magnetic memory (MRAM), a spin transfer torque writing type MRAM, a voltage torque writing type MRAM, or a magnetic disk device comprising the perpendicular magnetization-type magnetic tunnel junction element according to claim 7.

9. A method of using the perpendicular magnetization-type magnetic tunnel junction element according to claim 7 for at least one of a magnetoresistive random access magnetic memory (MRAM), a spin transfer torque writing type MRAM, a voltage torque writing type MRAM, or a magnetic disk device.

10. A method for manufacturing a perpendicularly magnetized film structure, the method comprising a step of providing a single-crystalline substrate having a cubic system structure having a (001) plane or a substrate having a layer having a cubic system structure or tetragonal system structure having a (001) plane,
a step of forming an underlayer composed of a conductive material having a good electric conductivity on the substrate,
a step of forming an iron-based alloy layer comprising aluminum on the underlayer,
a step of forming a first metal film composed of a predetermined metal element on the iron-based alloy layer, the metal element not containing aluminum,
a step of forming a second alloy film composed of a predetermined alloy element on the first metal film, the alloy element containing aluminum,
a step of forming an oxide layer by subjecting the first metal film and the second alloy film to an oxidation treatment to form a perpendicularly magnetized layer, and
a step of forming a nonmagnetic layer having a (001) plane on the perpendicularly magnetized layer.

11. The method for manufacturing a perpendicularly magnetized film structure according to claim 10, wherein the oxide layer is an oxide layer of a $Mg_{1-x}Al_x$ (0<x≤1) alloy.

12. A method for manufacturing a perpendicular magnetization-type magnetic tunnel junction element, the method comprising
a step of forming a substrate, an underlayer, a perpendicularly magnetized layer, and a nonmagnetic layer by the method for manufacturing a perpendicularly magnetized film structure according to claim 10, and
a step of forming, on the nonmagnetic layer, a second perpendicularly magnetized layer composed of a ferromagnetic material selected from the group consisting of a cobalt-iron alloy, a cobalt-iron-boron alloy, a manganese-gallium alloy, a manganese-germanium alloy, and an alloy of one or more elements selected from the group consisting of iron and cobalt and one or more elements selected from the group consisting of platinum and palladium.

13. A method for manufacturing a spintronic device, comprising the method for manufacturing a perpendicular magnetization-type magnetic tunnel junction element according to claim 12.

* * * * *